(12) United States Patent
Yamazaki

(10) Patent No.: US 9,809,449 B2
(45) Date of Patent: Nov. 7, 2017

(54) DISPLAY DEVICE

(71) Applicant: SEMICONDUCTOR ENERGY LABORATORY CO., LTD., Atsugi-shi, Kanagawa-ken (JP)

(72) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/248,649

(22) Filed: Aug. 26, 2016

(65) Prior Publication Data

US 2016/0362294 A1   Dec. 15, 2016

Related U.S. Application Data

(63) Continuation of application No. 14/626,011, filed on Feb. 19, 2015, now Pat. No. 9,431,428, which is a
(Continued)

(30) Foreign Application Priority Data

Apr. 19, 2013   (JP) .................................. 2013-088181

(51) Int. Cl.
*H01L 27/14*   (2006.01)
*B81B 7/00*   (2006.01)
(Continued)

(52) U.S. Cl.
CPC ............ *B81B 7/008* (2013.01); *B81B 3/0083* (2013.01); *G02B 26/02* (2013.01); *G02B 26/04* (2013.01);
(Continued)

(58) Field of Classification Search
None
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
(Continued)

*Primary Examiner* — Michael Lebentritt
(74) *Attorney, Agent, or Firm* — Nixon Peabody LLP; Jeffrey L. Costellia

(57) ABSTRACT

A display device capable of operating at high speed and with low power consumption is provided. A miniaturized display device occupying a small area is also provided. The display device includes a support; a display portion which includes a pixel; a light-blocking unit which is in the support and includes a light-blocking layer having a first opening overlapping with at least part of the pixel, and a movable light-blocking layer blocking light passing through the first opening; a transistor which is electrically connected to the light-blocking unit and includes an oxide semiconductor film; and a capacitor electrically connected to the transistor.

15 Claims, 20 Drawing Sheets

Related U.S. Application Data continuation of application No. 14/253,932, filed on Apr. 16, 2014, now Pat. No. 8,975,695.

(51) Int. Cl.

| | | |
|---|---|---|
| *B81B 3/00* | (2006.01) | |
| *H01L 27/12* | (2006.01) | |
| *H01L 29/24* | (2006.01) | |
| *G02B 26/02* | (2006.01) | |
| *H01L 29/786* | (2006.01) | |
| *G02B 26/04* | (2006.01) | |
| *G02F 1/1335* | (2006.01) | |
| *G02F 1/1362* | (2006.01) | |
| *G02F 1/1368* | (2006.01) | |
| *G02F 1/1333* | (2006.01) | |
| *G02F 1/1337* | (2006.01) | |

(52) U.S. Cl.
CPC ...... *G02F 1/1368* (2013.01); *G02F 1/133512* (2013.01); *G02F 1/136209* (2013.01); *G02F 1/136213* (2013.01); *H01L 27/1225* (2013.01); *H01L 27/1255* (2013.01); *H01L 29/24* (2013.01); *H01L 29/7869* (2013.01); *B81B 2201/047* (2013.01); *B81B 2203/0163* (2013.01); *B81B 2203/051* (2013.01); *B81B 2207/012* (2013.01); *G02F 1/133345* (2013.01); *G02F 1/133514* (2013.01); *G02F 1/133723* (2013.01)

(56) References Cited

U.S. PATENT DOCUMENTS

| | | | |
|---|---|---|---|
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,271,945 | B2 | 9/2007 | Hagood et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,519,945 | B2 | 8/2013 | Hagood et al. |
| 8,975,695 | B2 | 3/2015 | Yamazaki |
| 9,431,428 | B2 * | 8/2016 | Yamazaki ............ B81B 3/0083 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0300862 | A1 | 12/2010 | Tamura et al. |
| 2011/0175104 | A1 | 7/2011 | Yamazaki |
| 2012/0099049 | A1 | 4/2012 | Yamazaki et al. |
| 2012/0176570 | A1 | 7/2012 | Yamazaki et al. |
| 2012/0306562 | A1 | 12/2012 | Miyamoto et al. |
| 2012/0306842 | A1 | 12/2012 | Miyazawa et al. |
| 2014/0042443 | A1 | 2/2014 | Yamazaki |
| 2014/0204096 | A1 | 7/2014 | Shi |
| 2014/0267331 | A1 | 9/2014 | Villarreal et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2008-197668 A | 8/2008 |
| JP | 2008-533510 | 8/2008 |
| JP | 2011-166130 A | 8/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3: Invited Paper; Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5') Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu;or Zn] at Temperatures Over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Meiboom.S et al., "Theory of the Blue Phase of Cholesteric Liquid Crystals", Phys. Rev Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09: SID International Symposium Digest of Technical Papers, May 31, 2009, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09: Proceedings of the 16th Interntional Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.
Tsuda.K et al., "Ultra Low Power Consumption Technologies for Mobile TFT-LCDs", IDW '02: Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

415

416

DISPLAY DEVICE

BACKGROUND OF THE INVENTION

1. Field of the Invention

The present invention relates to a display device.

2. Description of the Related Art

Attention has recently been drawn to a display device using a mechanical shutter, which is an application of micro electro mechanical systems (MEMS), or microstructures, and such a shutter is referred to as a MEMS shutter below. In the display device using a MEMS shutter, each pixel is provided with a MEMS shutter which is opened and closed quickly with use of transistors so that images are displayed (for example, Patent Document 1).

REFERENCE

Patent Document

[Patent Document 1]
Japanese Published Patent Application No. 2008-197668

SUMMARY OF THE INVENTION

In a mechanically operating display device such as the one using a MEMS shutter, high-speed and low-power operation is necessary to improve image quality and reduce power consumption.

In view of the above, an object of one embodiment of the present invention is to provide a display device capable of operating at high speed and with low power consumption.

Furthermore, miniaturization of each element is also required with an increase in the integration density of a device. In view of this, another object of one embodiment of the present invention is to provide a miniaturized display device occupying a small area.

In order to solve the above problems, in one embodiment of the present invention, a transistor including an oxide semiconductor is used for part of a switching element which controls a light-blocking unit such as a MEMS shutter. In addition, a capacitor used for data storage is formed in manufacturing steps of the transistor. Such formation of the capacitor makes a step over the capacitor more gradual; for example, part of a light-blocking unit can be overlapped with the capacitor, thereby obtaining a miniaturized display device occupying a small area. The structure will be described below in detail.

One embodiment of the present invention is a display device including a support; a display portion which includes a pixel; a light-blocking unit which is in the support and includes a light-blocking layer having a first opening overlapping with at least part of the pixel, and a movable light-blocking layer blocking light passing through the first opening; a first transistor which is electrically connected to the light-blocking unit and includes an oxide semiconductor film; and a capacitor electrically connected to the first transistor. The capacitor includes a first conductive film over the same surface as the oxide semiconductor film; an oxide insulating film which covers the first transistor and includes a second opening on the first conductive film; a nitride insulating film which is over the oxide insulating film and in contact with the first conductive film in the second opening; and a second conductive film which is over the nitride insulating film and electrically connected to the first transistor.

In the above structure, the first transistor includes a gate electrode, a gate insulating film in contact with the gate electrode, the oxide semiconductor film in contact with the gate insulating film, and a pair of conductive films in contact with the oxide semiconductor film, and the first conductive film is in contact with the gate insulating film.

In the above structure, the first conductive film and the oxide semiconductor film include In, Ga, or Zn.

In the above structure, the light-blocking unit is a MEMS shutter.

The above structure further includes a second transistor which overlaps with and is electrically connected to the first transistor and the capacitor, and the second transistor is provided on a substrate including a semiconductor material.

One embodiment of the present invention allows for providing a display device capable of operating at high speed and with low power consumption, and also allows for providing a miniaturized display device occupying a small area.

DETAILED DESCRIPTION OF THE INVENTION

Figure 1:
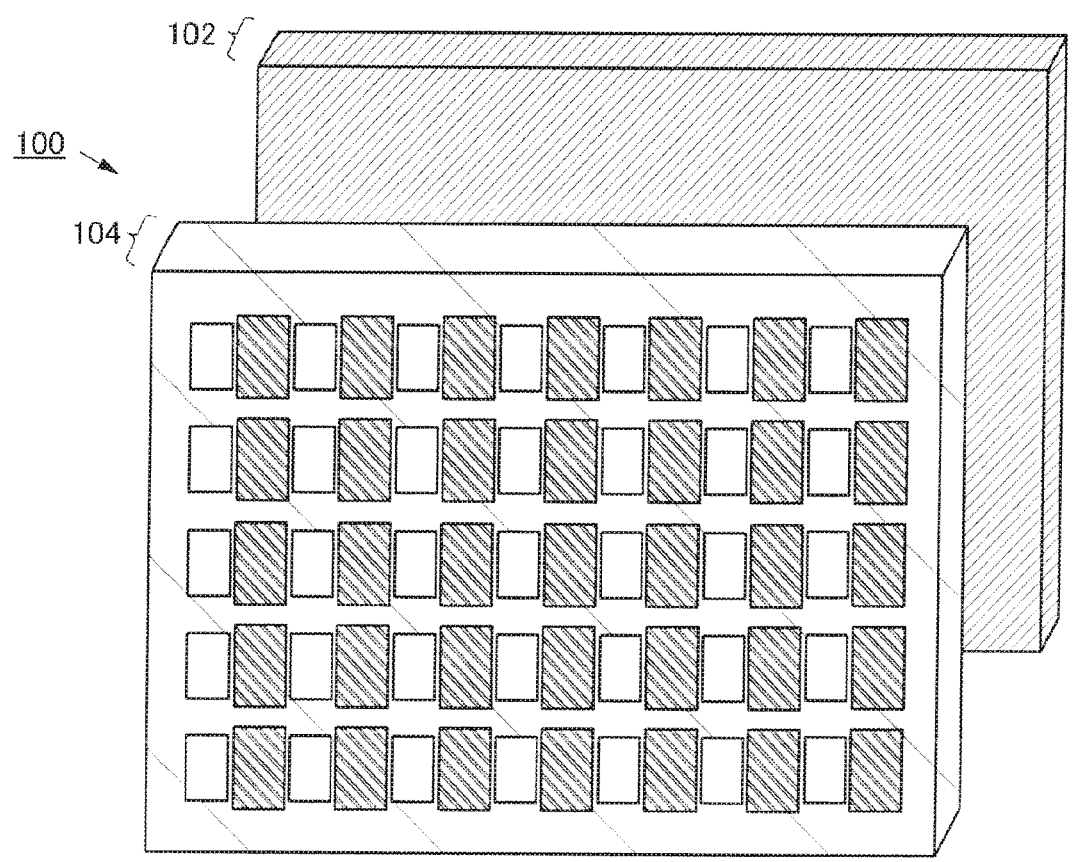
FIG. 1 is an oblique drawing of a display device.

Embodiments of the present invention will be described in detail below with reference to drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments. In the following embodiments, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, the scale is not necessarily limited to that illustrated in the drawings.

Terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

A voltage refers to a potential difference between two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

The term "electrically connected" includes the case where components are connected through an "object having any electric function". There is no particular limitation on the "object having any electric function" as long as electric signals can be transmitted and received between the components connected through the object.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines ranges from 80° to 100°, and accordingly also includes the case where the angle ranges from 85° to 95°.

Embodiment 1

In this embodiment, a semiconductor device of one embodiment of the present invention will be described with reference to drawings.

FIG. 1 is a schematic view illustrating a structure of a display device as an example of the semiconductor device. A display device 100 illustrated in FIG. 1 includes a display portion 102 and a shutter-like light-blocking unit 104.

The shutter-like light-blocking unit 104 allows switching between a light-blocking state and a transmission state. Note that the light-blocking unit 104 may be any unit having a function of switching between the light-blocking state and the transmission state; for example, it may be a shutter including a light-blocking layer having an opening and a movable light-blocking layer capable of blocking light passing through the opening.

Figure 2:
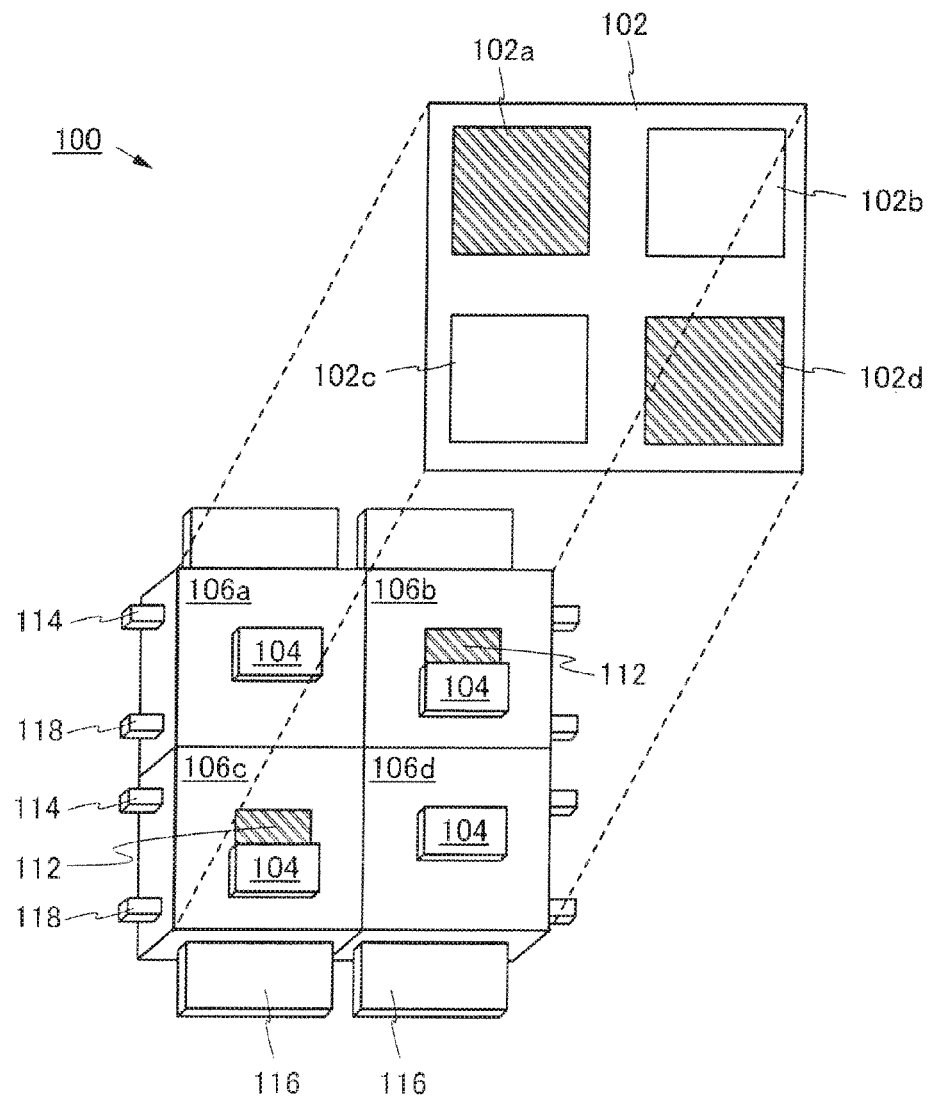
FIG. 2 is an isometric drawing of the display device.

FIG. 2 is an isometric drawing showing the display device 100 specifically. The display device 100 includes a plurality of supports 106a to 106d (also collectively referred to as a support 106) which are arranged in rows and columns. Each support 106 includes the light-blocking unit 104 and an opening 112. The support 106a corresponds to a pixel 102a. Similarly, the supports 106b to 106d correspond to pixels 102b to 102d, respectively. The pixels 102a to 102d constitute the display portion 102. The support 106 itself has light-transmitting properties. When one or more of supports 106 having specific colors corresponding to the respective pixels are selectively brought into a transmission state, color pixels can be produced in the display device 100.

The display portion 102 may be of a passive matrix type or an active matrix type; in the latter case, drive of elements is controlled by transistors. In either case, wirings electrically connected to pixels need to be provided in a grid pattern. In order to improve aperture ratio, the wirings in the display portion are preferably formed using a conductive film made of a light-transmitting conductive material.

When the display portion 102 is of the active matrix type, a transistor is preferably formed using a light-transmitting material. An oxide semiconductor film is preferably used as a light-transmitting semiconductor film of a transistor. Examples of the oxide semiconductor film include an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, and a Sn—Zn oxide.

The light-blocking unit 104 is a MEMS shutter using MEMS technology. The light-blocking unit 104 includes a MEMS structure body and a MEMS driving element. The MEMS structure body has a three-dimensional structure and includes a plurality of shutters which are partly movable microstructure bodies.

The MEMS structure body also includes, in addition to the light-blocking layer and the movable light-blocking layer, an actuator for making the movable light-blocking layer slide parallel to the substrate surface, a structure body supporting the movable light-blocking layer, and the like. An example of the structure of the MEMS shutter will be described in detail later.

The MEMS driving element includes a transistor that drives the movable light-blocking layer through the actuator. The transistor used in the MEMS driving element is preferably made of a light-transmitting material and can be formed using a material similar to that of a transistor used in the display portion 102. A conductive film used as a wiring in the MEMS driving element is preferably made of a light-transmitting conductive material.

Each support 106 is electrically connected to a scan line 114, a signal line 116, and a power source line 118. The light-blocking unit 104 is switched between the light-blocking state and the transmission state depending on potentials supplied from these lines.

Next, an example of the structure of the MEMS shutter that can be used as the light-blocking unit 104 will be described with reference to FIG. 3.

Figure 3:
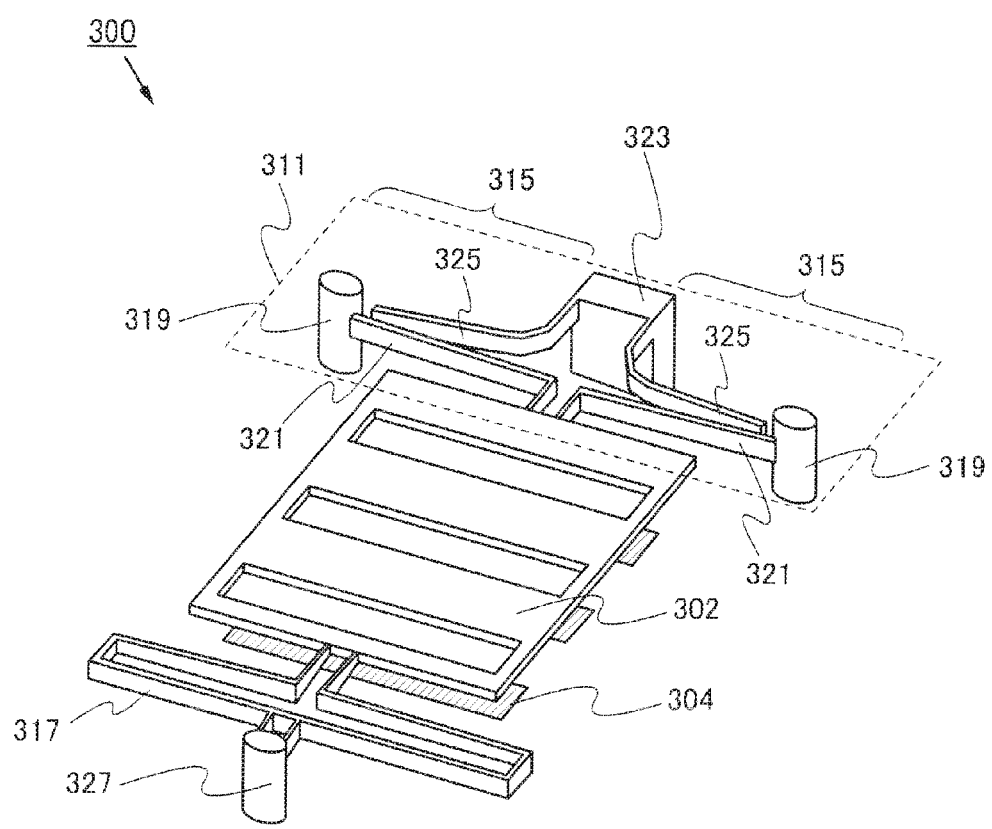
FIG. 3 is a perspective view of a shutter in the display device.

FIG. 3 illustrates a shutter 300. The shutter 300 includes a movable light-blocking layer 302 bonded to an actuator 311. The actuator 311 is provided over a light-blocking layer (not illustrated for simplicity) having an opening 304 and includes two flexible actuators 315. A side of the movable light-blocking layer 302 is electrically connected to the actuators 315. The actuators 315 have a function of moving the movable light-blocking layer 302 in the direction of the line connecting a structure body 323 and a structure body 327.

The actuators 315 each include a movable electrode 321 electrically connected to the movable light-blocking layer 302 and a structure body 319, and a movable electrode 325 electrically connected to the structure body 323. The movable electrode 325 is adjacent to the movable electrode 321. One end of the movable electrode 325 is electrically connected to the structure body 323, and the other end thereof can be freely moved. The other end of the movable electrode 325 that can be moved freely is curved so as to be closest to a connection portion of the movable electrode 321 and the structure body 319.

The other side of the movable light-blocking layer 302 is connected to a spring 317 which returns to its original shape after force is applied by the actuator 311. The spring 317 is connected to the structure body 327.

The structure bodies 319, the structure body 323, and the structure body 327 function as mechanical supports to make the movable light-blocking layer 302, the actuators 315, and the spring 317 float in the vicinity of the surface of the light-blocking layer having the opening 304.

Under the movable light-blocking layer 302, the opening 304 surrounded by the light-blocking layer is provided. Note that the shapes of the movable light-blocking layer 302 and the opening 304 are not limited to these.

The structure body 323 included in the shutter 300 is electrically connected to a transistor (not illustrated). The transistor drives the movable light-blocking layer. Thus, a given voltage can be applied from the transistor to the movable electrode 325 connected to the structure body 323. The structure bodies 319 and 327 are each connected to a ground electrode (GND). Accordingly, the movable electrode 321 connected to the structure body 319 and the spring 317 connected to the structure body 327 each have a potential of GND. Note that the structure bodies 319 and 327 may be electrically connected to a common electrode which can apply a given voltage. The structure bodies 319 and 327 may be replaced with another actuator 311 so that the shutter includes the two actuators 311.

When voltage is applied to the movable electrode 325, the movable electrode 325 and the movable electrode 321 are electrically attracted to each other by a potential difference therebetween. As a result, the movable light-blocking layer 302 connected to the movable electrode 321 is drawn toward the structure body 323 to move to the structure body 323. Because the movable electrode 321 functions as a spring, when the potential difference between the movable electrodes 321 and 325 is eliminated, the movable electrode 321 releases the stress accumulated therein so that the movable light-blocking layer 302 returns to its original position. In a state where the movable electrode 321 is drawn to the movable electrode 325, the movable light-blocking layer 302 may block the opening 304 or may be positioned so as not to overlap with the opening 304.

A method for manufacturing the shutter 300 will be described below. A sacrificial layer with a predetermined shape is formed by a photolithography process over the light-blocking layer having the opening 304. The sacrificial layer can be formed using, for example, an organic resin such as polyimide or acrylic, or an inorganic insulating film such as silicon oxide, silicon nitride, silicon oxynitride, or silicon nitride oxide. Note that in this specification and the like, silicon oxynitride contains more oxygen than nitrogen, and silicon nitride oxide contains more nitrogen than oxygen. The oxygen content and the nitrogen content are measured by Rutherford backscattering spectrometry (RBS) or hydrogen forward scattering spectrometry (HFS).

Next, a film of a light-blocking material is formed over the sacrificial layer by a printing method, a sputtering method, an evaporation method, or the like and then is selectively etched, whereby the shutter 300 is formed. Examples of the light-blocking material include a metal such as chromium, molybdenum, nickel, titanium, copper, tungsten, tantalum, neodymium, aluminum, or silicon, and an alloy or an oxide thereof. Alternatively, the shutter 300 is formed by an inkjet method. The shutter 300 is preferably formed to a thickness of 100 nm to 5 μm.

Then, the sacrificial layer is removed, whereby the shutter 300 which can be moved in a space can be formed. After that, a surface of the shutter 300 is preferably oxidized by oxygen plasma, thermal oxidation, or the like so that an oxide film is formed. Alternatively, an insulating film of alumina, silicon oxide, silicon nitride, silicon oxynitride, silicon nitride oxide, DLC (diamond like carbon), or the like is preferably formed on a surface of the shutter 300 by an atomic layer evaporation method or a CVD method. Formation of the insulating film on the shutter 300 can slow down the deterioration of the shutter 300 over time.

Next, a control circuit 200 including the light-blocking unit will be described with reference to FIG. 4.

Figure 4:
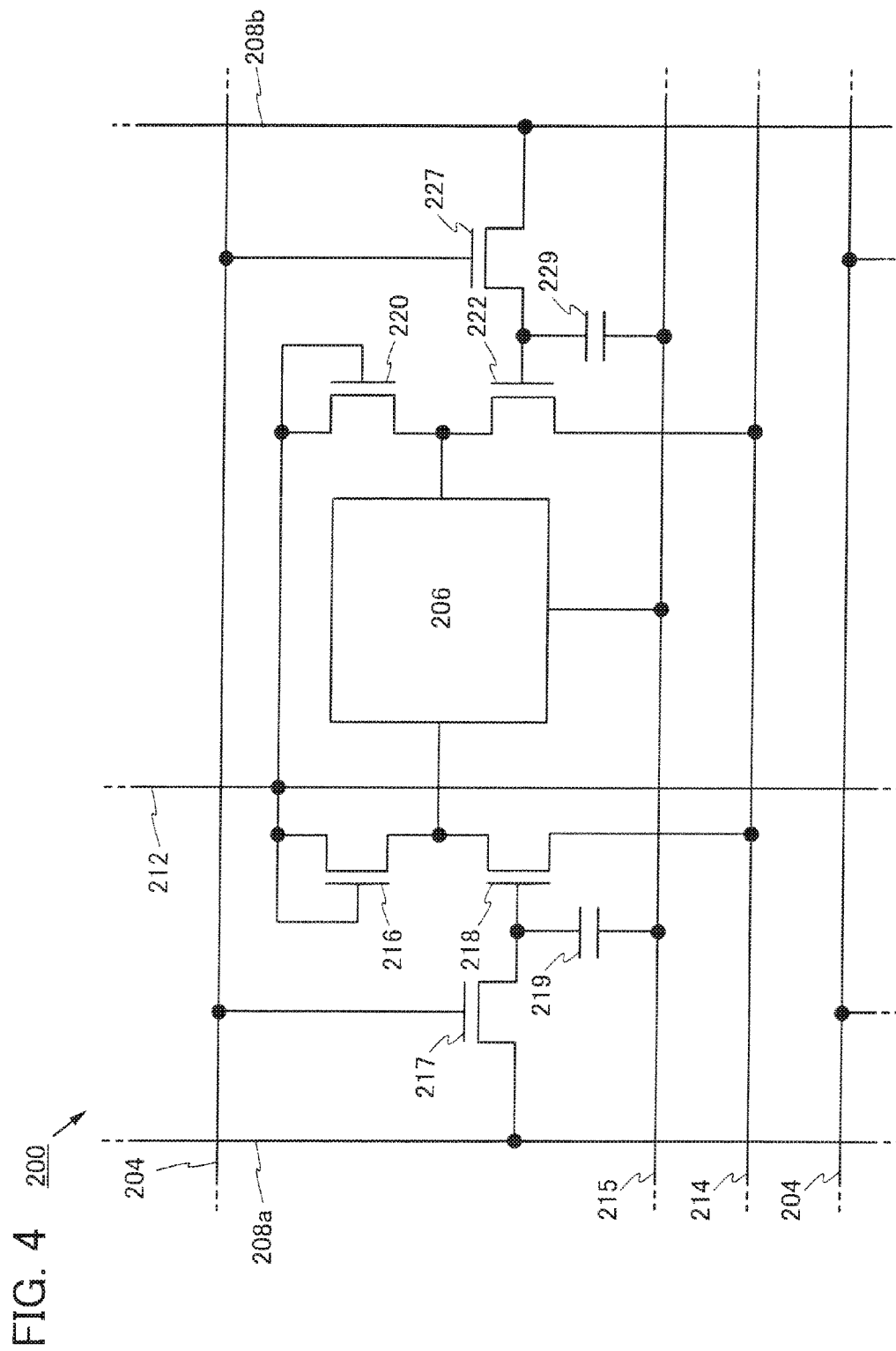
FIG. 4 is a schematic view of a control circuit in the display device.

FIG. 4 is a schematic view of the control circuit 200 in the display device. The control circuit 200 controls the array of pixels in each support 206 which includes a shutter provided with an actuator for making a light-blocking unit in a light-blocking state and an actuator for making the light-blocking unit in a transmission state. The pixels in the array each have a substantially square shape and the pitch, or the distance between the pixels, is 180 μm to 200 μm.

In the control circuit 200, a scan line 204 is provided for the pixels in each row, and a first signal line 208a and a second signal line 208b are provided for the pixels in each column. The first signal line 208a supplies a signal for making the light-blocking unit in the transmission state, whereas the second signal line 208b supplies a signal for making the light-blocking unit in the light-blocking state. The control circuit 200 also includes a charge line 212, an operation line 214, and a common power source line 215. The charge line 212, the operation line 214, and the common power source line 215 are shared between the pixels in rows and columns of the array.

The support 206 including each of the pixels is electrically connected to a transistor 216 charged to make the light-blocking unit in the transmission state, and a transistor 218 discharged to make the light-blocking unit in the transmission state. The transistor 218 is electrically connected to a transistor 217 to which data is written so that the light-blocking unit is brought into the transmission state, and a capacitor 219. The transistors 216 and 218 are electrically connected to the actuator for making the light-blocking unit in the transmission state.

The support 206 including each of the pixels is also electrically connected to a transistor 220 charged to make the light-blocking unit in the transmission state, and a transistor 222 discharged to make the light-blocking unit in the transmission state. The transistor 222 is electrically connected to a transistor 227 to which data is written so that the light-blocking unit is brought into the transmission state, and a capacitor 229. The transistors 220 and 222 are electrically connected to the actuator for making the light-blocking unit in the transmission state.

The transistors 216, 218, 220, and 222 include a material other than an oxide semiconductor material in a channel region, and therefore can operate at sufficiently high speed.

The transistors 217 and 227 include a highly purified oxide semiconductor in a channel region. When a transistor including a highly purified oxide semiconductor in a channel region is turned off, data can be retained in a floating node (e.g., a node at which the transistors 217 and 218 and the capacitor 219 are connected, or a node at which the transistors 222 and 227 and the capacitor 229 are connected). In addition, the transistor including a highly purified oxide semiconductor has an extremely low off-state current, which eliminates the need for a refresh operation or significantly reduces the frequency of the refresh operation, resulting in a sufficiently low power consumption.

The off-state current was actually measured using a transistor including an oxide semiconductor and having a channel width W of 1 m. As a result, in the case where the drain voltage $V_D$ is +1 V or +10 V and the gate voltage $V_G$ is in the range of −5 V to −20 V, the off-state current of the transistor was found to be lower than or equal to $1 \times 10^{-12}$ A which is the detection limit, namely, lower than or equal to 1 aA ($1 \times 10^{-18}$ A) per unit channel width (1 μm). As the result of more accurate measurements, the off-state current at room temperature (25° C.) was lower than or equal to approximately 40 zA/μm ($4 \times 10^{-20}$ A/μm) at a source-drain voltage of 4 V and lower than or equal to approximately 10 zA/μm ($1 \times 10^{-20}$ A/μm) at a source-drain voltage of 3.1 V. Even at 85° C., the off-state current was lower than or equal to approximately 100 zA/μm ($1 \times 10^{-19}$ A/μm) at a source-drain voltage of 3.1 V.

It is thus confirmed that the off-state current of a transistor including a highly purified oxide semiconductor is sufficiently low. For details about more accurate measurements of the off-state current, Japanese Published Patent Application No. 2011-166130 can be referred to.

A conductive film is formed on the same surface as an oxide semiconductor film of the transistors 217 and 227 and used as one electrode of each of the capacitors 219 and 229. There is a small step on the capacitors formed using such a conductive film, leading to easy integration and miniaturization of the display device. For example, part of a light-blocking unit or a transistor can be overlapped with the capacitor, thereby obtaining a miniaturized display device occupying a small area.

In the control circuit 200, voltage is applied to the charge line 212 first. Then, the transistors 216 and 220 are turned on because the charge line 212 is connected to a gate and a drain of each of the transistors 216 and 220. The minimum voltage needed to operate the shutter of the support 206 (e.g., 15 V) is applied to the charge line 212. The charge line 212 is set to 0 V after charge of the actuator for making the light-blocking unit in the light-blocking state and the actuator for making the light-blocking unit in the transmission state, whereby the transistors 216 and 220 are turned off. The charge in the two actuators is stored.

When a writing voltage $V_w$ is supplied to the scan line 204, data is sequentially written to the pixels in each row. During a period in which data is written to the pixels in a certain row, the control circuit 200 applies a data voltage to one of the first signal line 208a and the second signal line 208b corresponding to each column of the pixels. When the voltage $V_w$ is applied to the scan line 204 to which data is to be written, the transistors 217 and 227 in the corresponding row are turned on. When the transistors 217 and 227 are turned on, charge supplied from the first signal line 208a and the second signal line 208b is stored in the capacitors 219 and 229, respectively.

In the control circuit 200, the operation line 214 is connected to a source of each of the transistors 218 and 222. When the potential of the operation line 214 is much higher than that of the common power source line 215, the transistors 218 and 222 are not turned off regardless of the charge stored in the capacitors 219 and 229. In the control circuit 200, the transistors 218 and 222 are turned on/off depending on the charge of the data stored in the capacitor 219 or 229 when the potential of the operation line 214 is lower than or equal to that of the common power source line 215.

In the case where the transistor 218 or 222 is turned on, the charge of the actuator for making the light-blocking unit in the light-blocking state or the charge of the actuator for making the light-blocking unit in the transmission state flows through the transistor 218 or 222. For example, when only the transistor 218 is turned on, the charge of the actuator for making the light-blocking unit in the transmission state flows to the operation line 214 through the transistor 218. This causes a potential difference between the shutter of the support 206 and the actuator for making the light-blocking unit in the transmission state, so that the shutter is electrically attracted to the actuator and the transmission state is obtained.

The cross-sectional view shown below is of a transistor which is used as a switching element in the control circuit 200 and of a capacitor in which charge can be stored. Here, the transistor 217 and the capacitor 219, which are semiconductor devices in the control circuit 200, will be described with reference to FIG. 5.

A gate electrode 404 of a transistor in a pixel portion is formed over a substrate 402. There is no particular limitation on a material and the like of the substrate 402 as long as the material has heat resistance high enough to withstand at least heat treatment performed later. For example, a glass substrate, a ceramic substrate, a quartz substrate, or a sapphire substrate may be used as the substrate 402. Alternatively, an SOI substrate or the like may be used and still alternatively, any of these substrates provided with a semiconductor element may be used as the substrate 402. In the case where a glass substrate is used as the substrate 402, a large-sized liquid crystal display device can be manufactured using a glass substrate with any of the following sizes: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm).

Alternatively, a flexible substrate may be used as the substrate 402, and the transistor may be provided directly on the flexible substrate. Further alternatively, a separation layer may be provided between the substrate 402 and the transistor. The separation layer can be used when part or the whole of an element portion formed over the separation layer is completed and separated from the substrate 402 and transferred to another substrate. In such a case, the transistor can be transferred to a substrate having low heat resistance or a flexible substrate as well.

For the gate electrode 404, a metal element selected from aluminum, chromium, copper, tantalum, titanium, molybdenum, and tungsten, an alloy containing any of these metal elements as a component, an alloy containing these metal elements in combination, or the like can be used. Alternatively, one or more metal elements selected from manganese and zirconium may be used. The gate electrode 404 may have a single-layer structure or a layered structure of two or more layers. Examples of the structure include a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like. Alternatively, a film, an alloy film, or a nitride film which contains aluminum and one or more elements selected from titanium, tantalum, tungsten, molybdenum, chromium, neodymium, and scandium may be used.

The gate electrode 404 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to use a layered structure of the above light-transmitting conductive material and the above metal element.

An In—Ga—Zn-based oxynitride film, an In—Sn-based oxynitride film, an In—Ga-based oxynitride film, an In—Zn-based oxynitride film, a Sn-based oxynitride film, an In-based oxynitride film, a film of a metal nitride (such as InN or ZnN), or the like may be provided between the gate electrode 404 and an insulating film 405 serving as part of a gate insulating film. These films each have a work function 5 eV or higher, preferably 5.5 eV or higher, which is higher than the electron affinity of the oxide semiconductor. Therefore, the threshold voltage of the transistor including an oxide semiconductor can be shifted in the positive direction, and what is called a normally-off switching element can be achieved. For example, in the case where an In—Ga—Zn-based oxynitride film is used, an In—Ga—Zn-based oxynitride film whose nitrogen concentration is higher than at least that of an oxide semiconductor film 408a, specifically, an In—Ga—Zn-based oxynitride film whose nitrogen concentration is higher than or equal to 7 at. % is used.

The insulating film 405 and an insulating film 406 are formed over the substrate 402 and the gate electrode 404. The insulating films 405 and 406 serve as a gate insulating film of the transistor 217.

The insulating film 405 is preferably formed using a nitride insulating film of silicon nitride, silicon nitride oxide, aluminum nitride, or aluminum nitride oxide, for example.

The insulating film 406 can be formed to have a single-layer structure or a layered structure using, for example, any of silicon oxide, silicon oxynitride, silicon nitride oxide, silicon nitride, aluminum oxide, hafnium oxide, gallium oxide, Ga—Zn-based metal oxide, and silicon nitride. The insulating film 406 may be formed using a high-k material such as hafnium silicate ($HfSi_xO_y$), hafnium silicate to which nitrogen is added, hafnium aluminate ($HfAl_xO_y$), hafnium aluminate to which nitrogen is added, hafnium oxide, or yttrium oxide, in which case the gate leakage current of the transistor can be reduced.

The total thickness of the insulating films 405 and 406 is greater than or equal to 5 nm and less than or equal to 400 nm, preferably greater than or equal to 10 nm and less than or equal to 300 nm, and more preferably greater than or equal to 50 nm and less than or equal to 250 nm.

The oxide semiconductor film 408a and a conductive film 408b are formed over the insulating film 406. The oxide semiconductor film 408a is formed to overlap with the gate electrode 404 and functions as a channel region. The conductive film 408b functions as one electrode of the capacitor 219.

The oxide semiconductor film 408a and the conductive film 408b are each typically an In—Ga oxide, an In—Zn oxide, or an In-M-Zn oxide (M is Al, Ti, Ga, Y, Zr, La, Ce, Nd, or HO.

When the oxide semiconductor film 408a and the conductive film 408b include an In-M-Zn oxide, the proportion of In and the proportion of M, not taking Zn and O into consideration, are preferably greater than or equal to 25 atomic % and less than 75 atomic %, respectively, more preferably greater than or equal to 34 atomic % and less than 66 atomic %, respectively.

The energy gap of each of the oxide semiconductor film 408a and the conductive film 408b is greater than or equal to 2 eV, preferably greater than or equal to 2.5 eV, and more preferably greater than or equal to 3 eV. The use of such an oxide semiconductor having a wide energy gap reduces the off-state current of the transistor.

The thickness of each of the oxide semiconductor film 408a and the conductive film 408b is greater than or equal to 3 nm and less than or equal to 200 nm, preferably greater than or equal to 3 nm and less than or equal to 100 nm, and more preferably greater than or equal to 3 nm and less than or equal to 50 nm.

The oxide semiconductor film 408a and the conductive film 408b can be formed using In—Ga—Zn oxide with an atomic ratio of In:Ga:Zn=1:1:1 or 3:1:2. Note that the proportion of each atom in the atomic ratio of the oxide semiconductor film 408a and the conductive film 408b varies within a range of ±20% as an error.

Both the oxide semiconductor film 408a and the conductive film 408b are formed over the gate insulating film (here, over the insulating film 406) but differ in impurity concentration. Specifically, the impurity concentration in the conductive film 408b is higher than that in the oxide semiconductor film 408a. For example, the concentration of hydrogen contained in the oxide semiconductor film 408a is lower than $5\times10^{19}$ atoms/$cm^3$, preferably lower than $5\times10^{18}$ atoms/$cm^3$, more preferably lower than or equal to $1\times10^{18}$ atoms/$cm^3$, still more preferably lower than or equal to $5\times10^{17}$ atoms/$cm^3$, and further more preferably lower than or equal to $1\times10^{16}$ atoms/$cm^3$. The concentration of hydrogen contained in the conductive film 408b is higher than or equal to $8\times10^{19}$ atoms/$cm^3$, preferably higher than or equal to $1\times10^{20}$ atoms/$cm^3$, and more preferably higher than or equal to $5\times10^{20}$ atoms/$cm^3$. The concentration of hydrogen contained in the conductive film 408b is greater than or equal to 2 times, preferably greater than or equal to 10 times that in the oxide semiconductor film 408a.

The conductive film 408b has lower resistivity than the oxide semiconductor film 408a. The resistivity of the conductive film 408b is preferably greater than or equal to $1\times10^{-8}$ times and less than or equal to $1\times10^{-1}$ times the resistivity of the oxide semiconductor film 408a. The resistivity of the conductive film 408b is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

When the oxide semiconductor film 408a contains silicon or carbon which is an element belonging to Group 14, the oxide semiconductor film 408a includes increased oxygen vacancies to have n-type conductivity. Therefore, the concentration of silicon or carbon (which is measured by secondary ion mass spectrometry: SIMS) in the oxide semiconductor film 408a is set to lower than or equal to $2\times10^{18}$ atoms/cm$^3$, preferably lower than or equal to $2\times10^{17}$ atoms/cm$^3$.

The concentration of alkali metal or alkaline earth metal in the oxide semiconductor film 408a, which is measured by SIMS, is set to be lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, which may increase the off-state current of the transistor. Therefore, it is preferable to reduce the concentration of alkali metal or alkaline earth metal in the oxide semiconductor film 408a.

When containing nitrogen, the oxide semiconductor film 408a is likely to have n-type conductivity because of generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; for example, the concentration of nitrogen which is measured by SIMS is preferably set to be lower than or equal to $5\times10^{18}$ atoms/cm$^3$.

An oxide semiconductor film with low carrier density is used as the oxide semiconductor film 408a. For example, an oxide semiconductor film whose carrier density is lower than or equal to $1\times10^{17}$/cm$^3$, preferably lower than or equal to $1\times10^{15}$/cm$^3$, more preferably lower than or equal to $1\times10^{13}$/cm$^3$, and still more preferably lower than or equal to $1\times10^{11}$/cm$^3$ is used as the oxide semiconductor film 408a.

Note that, without limitation to that described above, a material with an appropriate composition may be used depending on required semiconductor characteristics and electrical characteristics (e.g., field-effect mobility and threshold voltage) of a transistor. In order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 408a be set to be appropriate.

The oxide semiconductor film 408a is in contact with the insulating films 406 and 412, which are formed using a material capable of improving the characteristics of the interface with the oxide semiconductor film. Accordingly, the oxide semiconductor film 408a functions as a semiconductor, and the transistor including the oxide semiconductor film 408a has good electrical characteristics.

Note that it is preferable to use, as the oxide semiconductor film 408a, an oxide semiconductor film which has a low impurity concentration and a low density of defect states, in which case the transistor can have good electrical characteristics. Here, the state in which impurity concentration is low and density of defect states is low (the amount of oxygen vacancy is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including a channel region formed in the oxide semiconductor film rarely has a negative threshold voltage (is rarely normally-on). A highly purified intrinsic or substantially highly purified intrinsic oxide semiconductor film has a low density of defect states and accordingly has few carrier traps in some cases. In addition, the highly purified intrinsic or substantially highly purified intrinsic oxide semiconductor film has an extremely low off-state current; even when an element has a channel width of $1\times10^6$ µm and a channel length (L) of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of 1 V to 10 V. Hence, the transistor in which the channel region is formed in the oxide semiconductor film has little variation in electrical characteristics and high reliability. Charges trapped by the trap states in the oxide semiconductor film take a long time to be released and may behave like fixed charges. Thus, the transistor in which the channel region is formed in the oxide semiconductor film having a high density of trap states has unstable electrical characteristics in some cases. Examples of the impurities include hydrogen, nitrogen, alkali metal, alkaline earth metal, and the like.

Figure 8A:
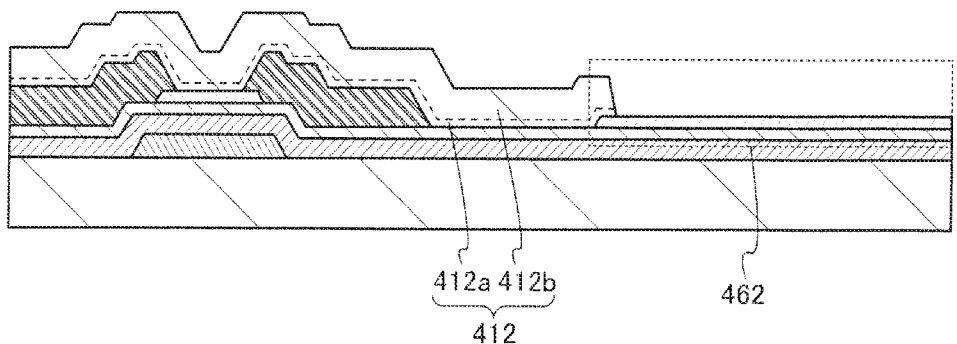
FIGS. 8A to 8C are cross-sectional views illustrating one mode of a method for manufacturing the semiconductor device.

In an opening 462 (see FIG. 8A), the conductive film 408b is in contact with an insulating film 414 (see FIG. 8C) formed using a nitride insulating film. The insulating film 414 is made of a material preventing diffusion of impurities from the outside, such as water, alkali metal, and alkaline earth metal, into the oxide semiconductor film, and further includes hydrogen. Therefore, when hydrogen in the insulating film 414 is diffused into the oxide semiconductor film formed at the same time as the oxide semiconductor film 408a, hydrogen is bonded to oxygen and electrons serving as carriers are generated in the oxide semiconductor film. When the insulating film 414 is formed by a plasma CVD method or a sputtering method, the oxide semiconductor film is exposed to plasma and oxygen vacancies are generated in the oxide semiconductor film. When hydrogen contained in the insulating film 414 enters the oxygen vacancies, electrons serving as carriers are generated. As a result, the oxide semiconductor film has higher conductivity and functions as a conductor. In other words, the oxide semiconductor film can be referred to as an oxide semiconductor film with high conductivity or a metal oxide film with high conductivity. Here, a metal oxide film which mainly contains a material similar to that of the oxide semiconductor film 408a and has increased conductivity is referred to as the conductive film 408b.

Note that one embodiment of the present invention is not limited thereto, and it is possible that the conductive film 408b be not in contact with the insulating film 414 depending on circumstances.

Also, one embodiment of the present invention is not limited thereto, and the conductive film 408b may be formed by a different process from that of the oxide semiconductor film 408a depending on circumstances. In that case, the conductive film 408b may include a different material from that of the oxide semiconductor film 408a. For example, the conductive film 408b may be formed using indium tin oxide, indium oxide containing tungsten oxide, indium zinc oxide containing tungsten oxide, indium oxide containing titanium oxide, indium tin oxide containing titanium oxide, indium tin oxide, indium zinc oxide, indium tin oxide containing silicon oxide, or the like.

In the semiconductor device shown in this embodiment, one electrode of the capacitor is formed at the same time as the semiconductor film of the transistor. In addition, the conductive film that serves as a pixel electrode is used as the other electrode of the capacitor. Thus, a step of forming another conductive film is not needed to form the capacitor, and the number of steps of manufacturing the semiconductor device can be reduced. Furthermore, the capacitor has light-transmitting properties because the pair of electrodes has light-transmitting properties. As a result, the area occupied by the capacitor can be increased and the aperture ratio in a pixel can be increased.

A structure of the oxide semiconductor film will be described below.

An oxide semiconductor film is roughly classified into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example of the amorphous oxide semiconductor film is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has higher degree of atomic order than the amorphous oxide semiconductor film. The density of defect states of the microcrystalline oxide semiconductor film is therefore lower than that of the amorphous oxide semiconductor film.

The CAAC-OS film is one of oxide semiconductor films including a plurality of crystal parts, and most of the crystal parts each fit into a cube whose one side is less than 100 nm. Thus, there is a case where a crystal part included in the CAAC-OS film fits into a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (planar TEM image), metal atoms are arranged in a triangular or hexagonal configuration in the crystal parts. However, there is no regularity of arrangement of metal atoms between different crystal parts.

From the results of the cross-sectional TEM image and the planar TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2 θ) is around 31°. This peak is derived from the (009) plane of the InGaZnO$_4$ crystal, which indicates that crystals in the CAAC-OS film have c-axis alignment, and that the c-axes are aligned in a direction perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2 θ is around 56°. This peak is derived from the (110) plane of the InGaZnO$_4$ crystal. Here, analysis (φ scan) is performed under the conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer which is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Furthermore, the crystallinity in the CAAC-OS film is not necessarily uniform. For example, in the case where crystal growth leading to the CAAC-OS film occurs from the vicinity of the top surface of the film, the crystallinity in the vicinity of the top surface is higher than that in the vicinity of the formation surface in some cases. When an impurity is added to the CAAC-OS film, the crystallinity in a region to which the impurity is added is changed, and the crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

A transistor including the CAAC-OS film has little variation in electrical characteristics due to irradiation with visible light or ultraviolet light. The transistor has high reliability accordingly.

Note that an oxide semiconductor film may be a stacked film including two or more films of an amorphous oxide semiconductor film, a microcrystalline oxide semiconductor film, and a CAAC-OS film, for example.

The conductive films 410a and 410b are formed to have a single-layer structure or a layered structure using, as a conductive material, any of metals such as aluminum, titanium, chromium, nickel, copper, yttrium, zirconium, molybdenum, silver, tantalum, and tungsten or an alloy containing any of these metals as its main component. Examples of the structure include a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

The insulating films 412 and 414 are formed over the insulating film 406, the oxide semiconductor film 408a, the conductive film 408b, and the conductive films 410a and 410b. Like the insulating film 406, the insulating film 412 is preferably formed using a material capable of improving the characteristics of the interface with the oxide semiconductor film. The insulating film 412 can be formed using an oxide insulating film. Here, the insulating film 412 includes a stack of insulating films 412a and 412b.

The insulating film 412a is an oxide insulating film through which oxygen is passed. Note that the insulating film 412a also serves as a film which relieves damage to the oxide semiconductor film 408a and the conductive film 408b at the time of forming the insulating film 412b later.

As the insulating film 412a, a silicon oxide film, a silicon oxynitride film, or the like with a thickness of 5 nm to 150 nm, preferably 5 nm to 50 nm can be used.

It is preferable that the amount of defects in the insulating film 412a be small, and typically the spin density corresponding to a signal which appears at g=2.001 due to a dangling bond of silicon, be lower than or equal to $3\times10^{17}$ spins/cm$^3$ by ESR measurement. This is because if the insulating film 412a has a high density of defects, oxygen is bonded to the defects and the amount of oxygen that permeates the insulating film 412a is decreased.

It is also preferable that the amount of defects at the interface between the insulating film 412a and each of the oxide semiconductor film 408a and the conductive film 408b be small, and typically the spin density corresponding to a signal which appears at g=1.93 due to an defect in the oxide semiconductor film 408a and the conductive film 408b be lower than or equal to $1\times10^{17}$ spins/cm$^3$, more preferably lower than or equal to the lower limit of detection by ESR measurement.

Note that all oxygen atoms entering the insulating film 412a from the outside are not moved to the outside of the insulating film 412a and some oxygen atoms remains in the insulating film 412a in some cases. In other cases, transfer of oxygen occurs in the insulating film 412a in such a manner that oxygen enters the insulating film 412a and oxygen contained in the insulating film 412a is moved to the outside of the insulating film 412a.

When an oxide insulating film which is permeable to oxygen is formed as the insulating film 412a, oxygen released from the insulating film 412b formed over the insulating film 412a can be moved to the oxide semiconductor film 408a and the conductive film 408b through the insulating film 412a.

The insulating film 412b is formed in contact with the insulating film 412a. The insulating film 412b is formed using an oxide insulating film which contains oxygen at a higher proportion than the stoichiometric composition. Part of oxygen is released by heating from the oxide insulating film which contains more oxygen than that in the stoichiometric composition. In the oxide insulating film which contains oxygen at a higher proportion than the stoichiometric composition, the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis.

As the insulating film 412b, a silicon oxide film, a silicon oxynitride film, or the like having a thickness of 30 nm to 500 nm, preferably 50 nm to 400 nm can be used.

It is preferable that the amount of defects in the insulating film 412b be small, and typically the spin density corresponding to a signal which appears at g=2.001 due to a dangling bond of silicon, be lower than $1.5\times10^{18}$ spins/cm$^3$, more preferably lower than or equal to $1\times10^{18}$ spins/cm$^3$ by ESR measurement. Note that the defect density of the insulating film 412b may be higher than that of the insulating film 412a because the insulating film 412b is more apart from the oxide semiconductor film 408a and the conductive film 408b than the insulating film 412a is.

When the nitride insulating film having a blocking effect against oxygen, hydrogen, water, alkali metal, alkaline earth metal, and the like is provided as the insulating film 414, it is possible to prevent outward diffusion of oxygen from the oxide semiconductor film 408a and the conductive film 408b. The nitride insulating film is formed using silicon nitride, silicon nitride oxide, aluminum nitride, aluminum nitride oxide, or the like.

Over the nitride insulating film having a blocking effect against oxygen, hydrogen, water, alkali metal, alkaline earth metal, and the like, an oxide insulating film having a blocking effect against oxygen, hydrogen, water, and the like may be provided. Examples of the oxide insulating film having a blocking effect against oxygen, hydrogen, water, and the like include aluminum oxide, aluminum oxynitride, gallium oxide, gallium oxynitride, yttrium oxide, yttrium oxynitride, hafnium oxide, and hafnium oxynitride. In order to control the charge capacity of the capacitor, a nitride insulating film or an oxide insulating film may be further provided over the nitride insulating film having a blocking effect against oxygen, hydrogen, water, alkali metal, alkaline earth metal, and the like, as appropriate.

A conductive film 416 is formed over the insulating film 414. The conductive film 416 is electrically connected to the conductive film 410b through an opening 464 (see FIG. 8C) and serves as a pixel electrode of a pixel. The conductive film 416 can also function as one electrode of the capacitor.

The conductive film 416 can be formed using a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added.

An alignment film 418 can be formed using an organic resin such as polyimide. The thickness of the alignment film 418 is preferably greater than or equal to 40 nm and less than or equal to 100 nm, more preferably greater than or equal to 50 nm and less than or equal to 90 nm. With such a thickness, the pretilt angle of a liquid crystal material can be made large, which can reduce disclination.

A liquid crystal element 422 is sandwiched between a pair of substrates (the substrate 402 and a substrate 442).

The liquid crystal element 422 includes the conductive film 416 over the substrate 402, the alignment film 418, an alignment film 452, a liquid crystal layer 420, and a conductive film 450. The conductive film 416 having light-transmitting properties serves as one electrode of the liquid crystal element 422, and the conductive film 450 serves as the other electrode of the liquid crystal element 422. Although not illustrated, a transistor for driving the liquid crystal element 422 is separately provided.

A film having a coloring property (hereinafter referred to as a coloring film 446) is formed on the substrate 442. The coloring film 446 functions as a color filter. In addition, a light-blocking film 444 adjacent to the coloring film 446 is formed on the substrate 442. The light-blocking film 444 functions as a black matrix. The coloring film 446 is not necessarily provided in the case where the liquid crystal display device is a monochrome display device, for example.

The coloring film 446 is a coloring film that transmits light in a specific wavelength range. For example, a red (R) color filter for transmitting light in a red wavelength range, a green (G) color filter for transmitting light in a green wavelength range, or a blue (B) color filter for transmitting light in a blue wavelength range can be used.

The light-blocking film 444 preferably has a function of blocking light in a particular wavelength region, and can be a metal film or an organic insulating film including a black pigment.

An insulating film 448 is formed on the coloring film 446. The insulating film 448 functions as a planarization layer or suppresses diffusion of impurities in the coloring film 446 to the liquid crystal element side.

The conductive film 450 is formed on the insulating film 448. The conductive film 450 serves as the other of the pair of electrodes of the liquid crystal element in the pixel portion. Note that an alignment film 418 is formed over the conductive film 416 and the alignment film 452 is formed on the conductive film 450.

The liquid crystal layer 420 is formed between the conductive film 416 and the conductive film 450. The liquid crystal layer 420 is sealed between the substrate 402 and the substrate 442 with the use of a sealant (not illustrated). The sealant is preferably in contact with an inorganic material to prevent entry of moisture and the like from the outside.

A spacer may be provided between the conductive film 416 and the conductive film 450 to maintain the thickness of the liquid crystal layer 420 (also referred to as a cell gap).

A method for manufacturing an element portion over the substrate 402 in the liquid crystal display device illustrated in FIG. 5 will be described with reference to FIGS. 6A to 6C, FIGS. 7A to 7C, FIGS. 8A to 8C, and FIGS. 9A and 9B. Here, the element portion over the substrate 402 refers to a region sandwiched between the substrate 402 and the alignment film 418.

First, the substrate 402 is prepared. Here, a glass substrate is used as the substrate 402.

Next, a conductive film is formed over the substrate 402 and processed into desired regions, so that the gate electrode 404 is formed. The gate electrode 404 can be formed in such a manner that a mask is formed in the desired regions by first patterning and regions not covered with the mask are etched (see FIG. 6A).

The gate electrode 404 can be typically formed by an evaporation method, a CVD method, a sputtering method, a spin coating method, or the like.

Next, the insulating film 405 is formed over the substrate 402 and the gate electrode 404, and then the insulating film 406 is formed over the insulating film 405.

The insulating films 405 and 406 can be formed by a sputtering method, a CVD method, or the like. Note that it is preferable that the insulating films 405 and 406 be formed in succession in a vacuum, in which case entry of impurities is suppressed.

Figure 6A:
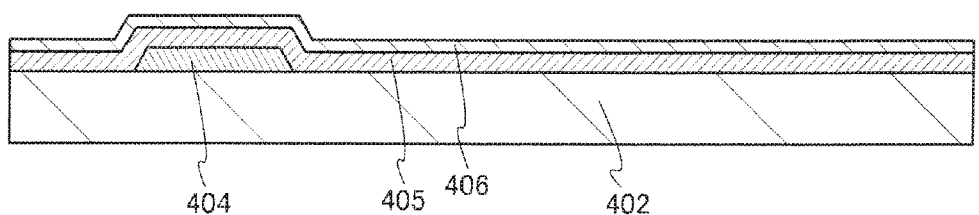
FIGS. 6A to 6C are cross-sectional views illustrating one mode of a method for manufacturing the semiconductor device.
Figure 6B:
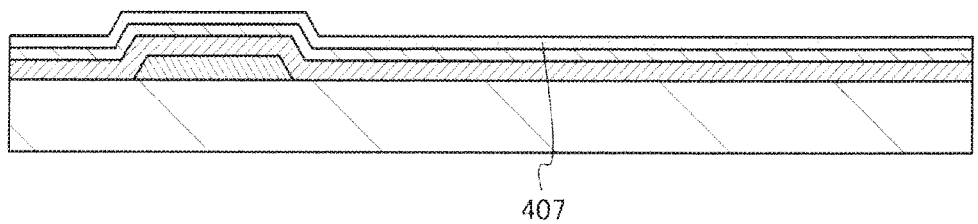
Figure 6C:
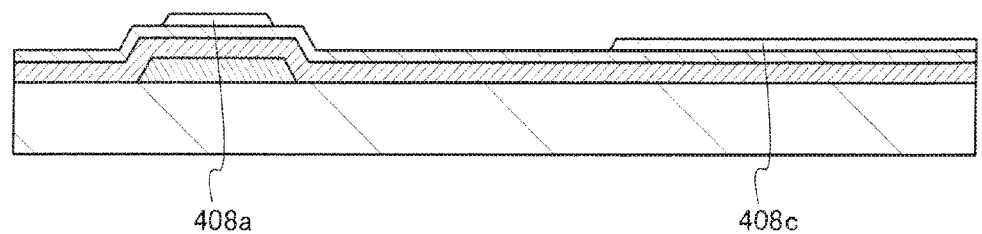

Next, an oxide semiconductor film 407 is formed over the insulating film 406 (see FIG. 6B).

The oxide semiconductor film 407 can be formed by a sputtering method, a coating method, a pulsed laser deposition method, a laser ablation method, or the like.

Next, the oxide semiconductor film 407 is processed into desired regions, so that the oxide semiconductor film 408a and an oxide semiconductor film 408c having island-like shapes are formed. The oxide semiconductor films 408a and 408c can be formed in such a manner that a mask is formed in the desired regions by second patterning and regions not covered with the mask are etched. For the etching, dry etching, wet etching, or a combination of dry etching and wet etching can be employed (see FIG. 6C).

After that, heat treatment may be performed so that hydrogen, water, and the like included in the oxide semiconductor films 408a and 408c are released to reduce the concentrations of hydrogen and water in the oxide semiconductor films 408a and 408c. As a result, highly purified oxide semiconductor films 408a and 408c can be formed. The heat treatment is performed typically at a temperature of 250° C. to 650° C., preferably 300° C. to 500° C. When the heat treatment is performed typically at a temperature of 300° C. to 400° C., preferably 320° C. to 370° C., warp or shrinking of a large-sized substrate can be reduced to improve yield.

An electric furnace, an RTA apparatus, or the like can be used for the heat treatment. With the use of an RTA apparatus, the heat treatment can be performed at a temperature higher than or equal to the strain point of the substrate if the heating time is short. This leads to shortening of the heat treatment time and reduces warp of the substrate during the heat treatment, which is particularly advantageous to a large-sized substrate.

The heat treatment may be performed under an atmosphere of nitrogen, oxygen, ultra-dry air (air with a water content of 20 ppm or less, preferably 1 ppm or less, and more preferably 10 ppb or less), or a rare gas (argon, helium, or the like). The atmosphere of nitrogen, oxygen, ultra-dry air, or a rare gas preferably does not contain hydrogen, water, and the like. After heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancies in the oxide semiconductor film can be reduced.

Figure 7A:
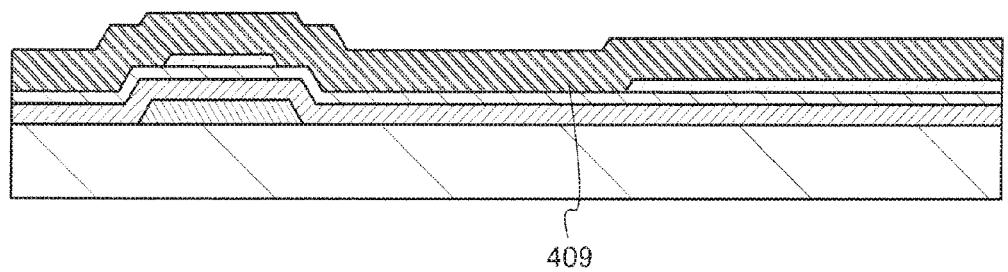
FIGS. 7A to 7C are cross-sectional views illustrating one mode of a method for manufacturing the semiconductor device.
Figure 7B:
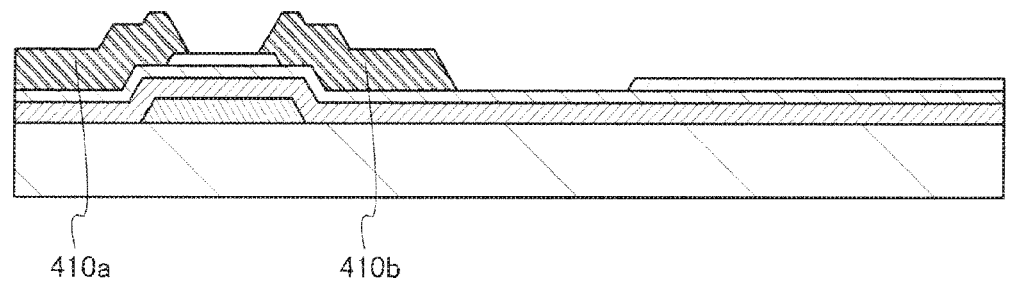

Next, a conductive film 409 is formed over the insulating film 406, the oxide semiconductor film 408a, and the oxide semiconductor film 408c (see FIG. 7A).

The conductive film 409 can be formed by a sputtering method, for example.

Then, the conductive film 409 is processed into desired regions, so that the conductive films 410a and 410b are formed. The conductive films 410a and 410b can be formed in such a manner that a mask is formed in the desired regions by third patterning and regions not covered with the mask are etched (see FIG. 7B).

Figure 7C:
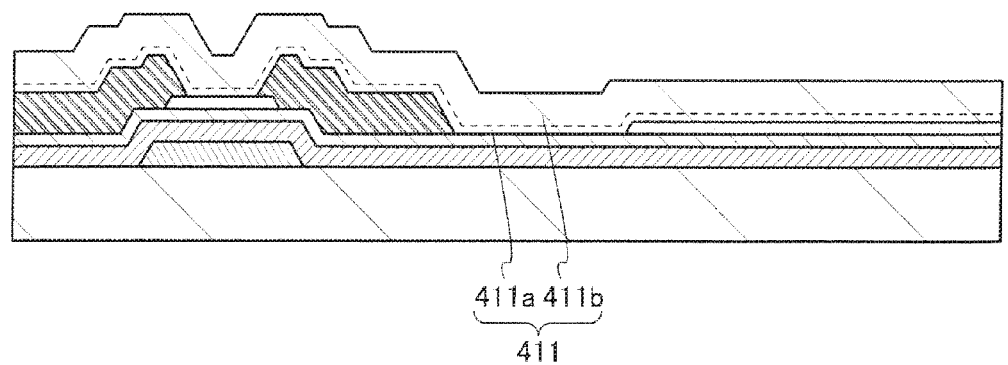

Next, an insulating film 411 including a stack of an insulating film 411a and an insulating film 411b is formed to cover the insulating film 406, the oxide semiconductor film 408a, the oxide semiconductor film 408c, the conductive film 410a, and the conductive film 410b (see FIG. 7C).

Note that after the insulating film 411a is formed, the insulating film 411b is preferably formed in succession without exposure to the air. After the insulating film 411a is formed, the insulating film 411b is formed in succession by adjusting at least one of the flow rate of a source gas, pressure, a high-frequency power, and a substrate temperature without exposure to the air, whereby the concentration of impurities attributed to the atmospheric component at the interface between the insulating film 411a and the insulating film 411b can be reduced and oxygen in the insulating film 411b can be moved to the oxide semiconductor films 408a and 408c, reducing the amount of oxygen vacancies in the oxide semiconductor films 408a and 408c.

As the insulating film 411a, a silicon oxide film or a silicon oxynitride film can be formed under the following conditions: the substrate placed in a treatment chamber of a plasma CVD apparatus that is vacuum-evacuated is held at a temperature higher than or equal to 180° C. and lower than or equal to 400° C., preferably higher than or equal to 200° C. and lower than or equal to 370° C., the pressure in the treatment chamber is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the insulating film 411a. Typical examples of the deposition gas containing silicon include silane, disilane, trisilane, and silane fluoride. Examples of the oxidizing gas include oxygen, ozone, dinitrogen monoxide, and nitrogen dioxide.

Under the above conditions, an oxide insulating film which is permeable to oxygen can be formed as the insulating film 411a. In addition, by providing the insulating film 411a, damage to the oxide semiconductor films 408a and 408c can be reduced in a later step of forming the insulating film 411b.

Under these film formation conditions, the bonding strength of silicon and oxygen becomes strong when the substrate temperature is the deposition temperature of the insulating film 411a. Thus, as the insulating film 411a, a dense and hard oxide insulating film which is permeable to oxygen, typically, a silicon oxide film or a silicon oxynitride film of which etching using hydrofluoric acid of 0.5 wt % at 25° C. is performed at a rate of 10 nm/min or lower, preferably 8 nm/min or lower can be formed.

The insulating film 411a is formed while heating is performed; as a result, hydrogen, water, or the like contained in the oxide semiconductor films 408a and 408c can be released in the step.

In addition, since heating is performed in the step of forming the insulating film 411a, the exposed oxide semiconductor films 408a and 408c are not subjected to heating for a long time. This reduces the amount of oxygen released from the oxide semiconductor films by heat treatment. That is, the amount of oxygen vacancies in the oxide semiconductor films can be reduced.

Furthermore, by setting the pressure in the treatment chamber to be greater than or equal to 100 Pa and less than or equal to 250 Pa, the amount of water contained in the insulating film 411a is reduced; thus, variation in electrical characteristics of the transistor can be reduced and change in threshold voltage can be inhibited.

Moreover, by setting the pressure in the treatment chamber to be greater than or equal to 100 Pa and less than or equal to 250 Pa, damage to the oxide semiconductor films 408a and 408c can be reduced when the insulating film 411a is formed, resulting in a reduced amount of oxygen vacancies contained in the oxide semiconductor films 408a and 408c. In particular, when the film formation temperature of the insulating film 411a or the insulating film 411b which is formed later is set to be high, typically higher than 220° C., part of oxygen contained in the oxide semiconductor films 408a and 408c is released so that oxygen vacancies are easily formed. In addition, when the film formation conditions for reducing the amount of defects in the insulating film 411b which is formed later are used to increase the reliability of the transistor, the amount of released oxygen is likely to be reduced. These make it difficult to reduce oxygen vacancies in the oxide semiconductor films 408a and 408c in some cases. However, by setting the pressure in the treatment chamber to be greater than or equal to 100 Pa and less than or equal to 250 Pa to reduce damage to the oxide semiconductor films 408a and 408c at the time of forming the insulating film 411a, oxygen vacancies in the oxide semiconductor films 408a and 408c can be reduced even with a small amount of oxygen released from the insulating film 411b.

Note that when the ratio of the amount of the oxidizing gas to the amount of the deposition gas containing silicon is 100 or higher, the hydrogen content in the insulating film 411a can be reduced. Consequently, the amount of hydrogen entering the oxide semiconductor films 408a and 408c can be reduced, inhibiting the negative shift in the threshold voltage of the transistor.

As the insulating film 411b, a silicon oxide film or a silicon oxynitride film is formed under the following conditions: the substrate placed in a treatment chamber of a plasma CVD apparatus that is vacuum-evacuated is held at a temperature higher than or equal to 180° C. and lower than or equal to 280° C., preferably higher than or equal to 200° C. and lower than or equal to 240° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and a high-frequency power higher than or equal to 0.17 W/cm$^2$ and lower than or equal to 0.5 W/cm$^2$, preferably higher than or equal to 0.25 W/cm$^2$ and lower than or equal to 0.35 W/cm$^2$ is supplied to an electrode provided in the treatment chamber.

A deposition gas containing silicon and an oxidizing gas are preferably used as the source gas of the insulating film 411b. Typical examples of the deposition gas containing silicon include silane, disilane, trisilane, and silane fluoride. Examples of the oxidizing gas include oxygen, ozone, dinitrogen monoxide, and nitrogen dioxide.

As the film formation conditions for the insulating film 411b, the high-frequency power having the above power density is supplied to the treatment chamber having the above pressure, whereby the decomposition efficiency of the source gas in plasma is increased, oxygen radicals are increased, and oxidation of the source gas is promoted; therefore, the oxygen content in the insulating film 411b becomes higher than that in the stoichiometric composition. On the other hand, when a substrate temperature is the above film formation temperature of the insulating film 411b, part of oxygen in the film is released by heat treatment because of a weak bond between silicon and oxygen. Thus, it is possible to form an oxide insulating film which contains oxygen at a higher proportion than the stoichiometric composition and from which part of oxygen is released by heating. Furthermore, since the insulating film 411a is provided over the oxide semiconductor films 408a and 408c, in the step of forming the insulating film 411b, the insulating film 411a serves as a protective film for the oxide semiconductor films 408a and 408c. As a result, the insulating film 411b can be formed using the high-frequency power having a high power density while damage to the oxide semiconductor films 408a and 408c is reduced.

Note that in the film formation conditions for the insulating film 411b, the flow rate of the deposition gas containing silicon relative to the oxidizing gas can be increased, in which case the amount of defects in the insulating film 411b is reduced. Typically, it is possible to form an oxide insulating film in which the amount of defects is small, i.e., the spin density corresponding to a signal which appears at g=2.001 due to a dangling bond of silicon is lower than $6 \times 10^{17}$ spins/cm$^3$, preferably lower than or equal to $3 \times 10^{17}$ spins/cm$^3$, and more preferably lower than or equal to $1.5 \times 10^{17}$ spins/cm$^3$ by ESR measurement. As a result, the reliability of the transistor can be improved.

Next, heat treatment is performed. The heating temperature is typically higher than or equal to 150° C. and lower than the strain point of the substrate, preferably higher than or equal to 200° C. and lower than or equal to 450° C., and more preferably higher than or equal to 300° C. and lower than or equal to 450° C. When the heat treatment is performed typically at a temperature of 300° C. to 400° C., preferably 320° C. to 370° C., warp or shrinking of a large-sized substrate can be reduced to improve yield.

An electric furnace, an RTA apparatus, or the like can be used for the heat treatment. With the use of an RTA apparatus, the heat treatment can be performed at a temperature higher than or equal to the strain point of the substrate if the heating time is short. This leads to shortening of the heat treatment time.

The heat treatment may be performed under an atmosphere of nitrogen, oxygen, ultra-dry air (air with a water content of 20 ppm or less, preferably 1 ppm or less, and more preferably 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the insulating film 411b can be moved to the oxide semiconductor films 408a and 408c, reducing oxygen vacancies contained in the oxide semiconductor films 408a and 408c. Consequently, the amount of oxygen vacancies in the oxide semiconductor films 408a and 408c can be further reduced.

In the case where water, hydrogen, or the like is contained in the insulating films 411a and 411b, the water, hydrogen, or the like contained in the insulating films 411a and 411b is moved to the oxide semiconductor films 408a and 408c when the insulating film 413 having a function of blocking water, hydrogen, and the like is formed later and heat treatment is performed, so that defects are generated in the oxide semiconductor films 408a and 408c. However, by the heating, water, hydrogen, or the like contained in the insulating films 411a and 411b can be released; thus, variation in electrical characteristics of the transistor can be reduced and change in threshold voltage can be inhibited.

Note that when the insulating film 411b is formed over the insulating film 411a while being heated, oxygen can be moved to the oxide semiconductor films 408a and 408c and oxygen vacancies in the oxide semiconductor films 408a and 408c can be reduced; thus, the heat treatment is not necessarily performed.

When the conductive films 410a and 410b are formed, the oxide semiconductor films 408a and 408c are damaged by the etching of the conductive film, so that oxygen vacancies are generated on the back channel side of the oxide semiconductor film 408a (the side of the oxide semiconductor film 408a that is opposite the side facing the gate electrode 404). However, with the use of the oxide insulating film containing oxygen at a higher proportion than the stoichiometric composition as the insulating film 411b, the oxygen vacancies generated on the back channel side can be repaired by heat treatment. This reduces defects contained in the oxide semiconductor film 408a to improve the reliability of the transistor.

Note that the heat treatment may be performed after the formation of the opening 462 which is formed later.

Then, the insulating film 411 is processed into desired regions, so that the insulating film 412 and the opening 462 are formed. The insulating film 412 and the opening 462 can be formed in such a manner that a mask is formed in the desired regions by fourth patterning and regions not covered with the mask are etched (see FIG. 8A).

The opening 462 is formed so as to expose the surface of the oxide semiconductor film 408c. An example of a formation method of the opening 462 includes, but not limited to, a dry etching method. Alternatively, a wet etching method or a combination of dry etching and wet etching can be employed for formation of the opening 462.

Figure 8B:
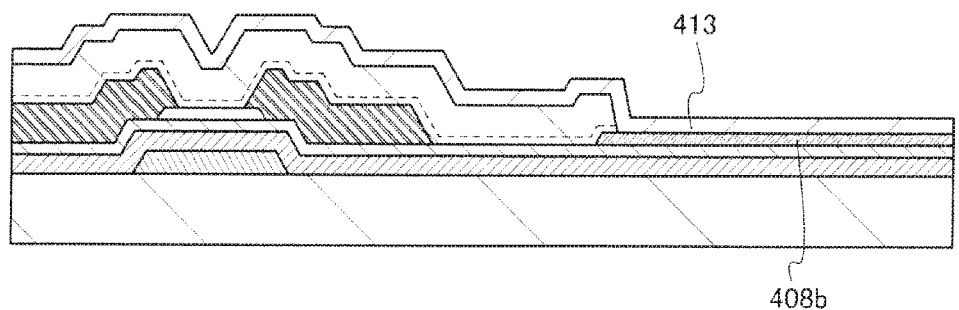
Figure 8C:
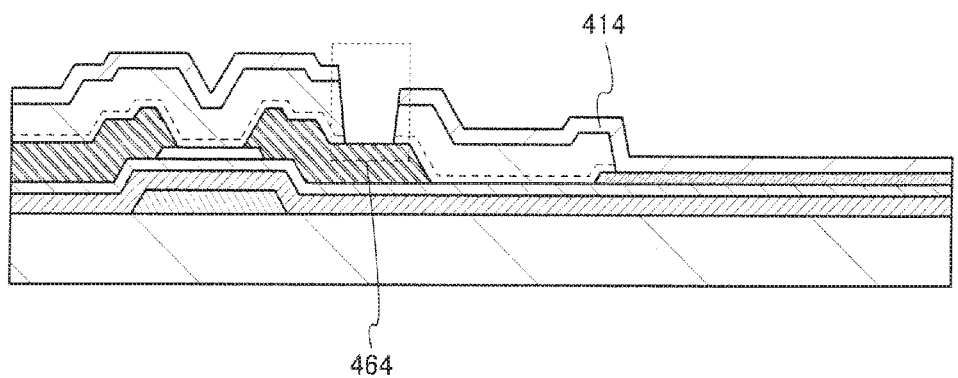

Next, the insulating film 413 is formed over the insulating film 406, the insulating film 412, and the oxide semiconductor film 408c (see FIG. 8B).

The insulating film 413 is preferably formed using a material that can prevent an external impurity such as oxygen, hydrogen, water, alkali metal, or alkaline earth metal, from diffusing into the oxide semiconductor film, more preferably formed using the material containing hydrogen, and typically an inorganic insulating material containing nitrogen, such as a nitride insulating film, can be used. The insulating film 413 can be formed by a CVD method or the like.

The insulating film 413 is made of a material preventing diffusion of impurities from the outside, such as water, alkali metal, and alkaline earth metal, into the oxide semiconductor film, and further includes hydrogen. Therefore, when hydrogen in the insulating film 413 is diffused into the oxide semiconductor film 408c, hydrogen is bonded to oxygen and electrons serving as carriers are generated in the oxide semiconductor film 408c. When the insulating film 413 is formed by a plasma CVD method or a sputtering method, the oxide semiconductor film is exposed to plasma and oxygen vacancies are generated in the oxide semiconductor film. When hydrogen contained in the insulating film 414 enters the oxygen vacancies, electrons serving as carriers are generated. As a result, the oxide semiconductor film 408c has higher conductivity and becomes the conductive film 408b.

The silicon nitride film is preferably formed at a high temperature to have an improved blocking property; for example, the silicon nitride film is preferably formed at a substrate temperature of 100° C. to 400° C., more preferably at a temperature of 300° C. to 400° C. When the silicon nitride film is formed at a high temperature, a phenomenon in which oxygen is released from the oxide semiconductor used for the oxide semiconductor film 408a and the carrier concentration is increased is caused in some cases; therefore, the upper limit of the temperature is a temperature at which the phenomenon is not caused.

Then, the insulating films 413 and 412 are processed into desired regions, so that the insulating film 414 and the opening 464 are formed. The insulating film 414 and the opening 464 can be formed in such a manner that a mask is formed in the desired regions by fifth patterning and regions not covered with the mask are etched (see FIG. 8C).

The opening 464 is formed so as to expose the surface of the conductive film 410b.

An example of a formation method of the opening 464 includes, but not limited to, a dry etching method. Alternatively, a wet etching method or a combination of dry etching and wet etching can be employed for formation of the opening 464.

Figure 9A:
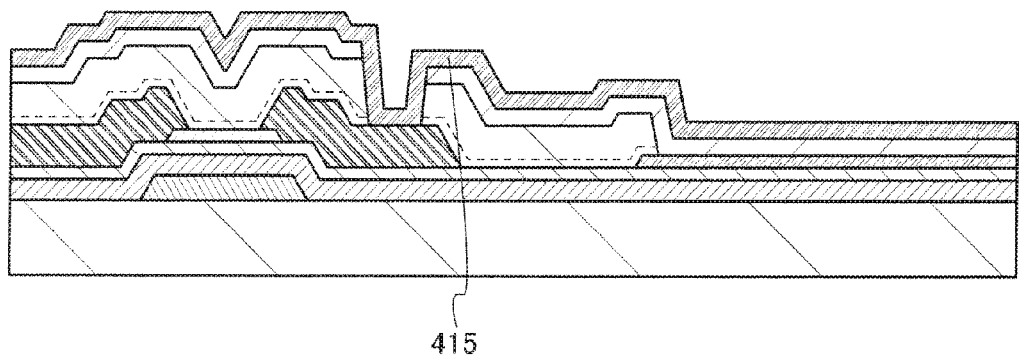
FIGS. 9A and 9B are cross-sectional views illustrating one mode of a method for manufacturing the semiconductor device.
Figure 9B:
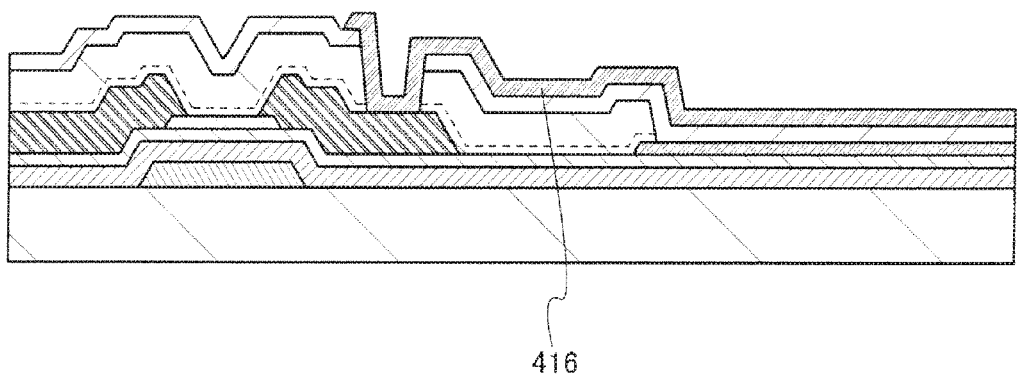

Then, a conductive film 415 is formed over the insulating film 414 so as to cover the opening 464 (see FIG. 9A).

The conductive film 415 can be formed by a sputtering method or the like.

Then, the conductive film 415 is processed into desired regions, so that the conductive film 416 is formed. The conductive film 416 can be formed in such a manner that a mask is formed in the desired regions by sixth patterning and regions not covered with the mask are etched (see FIG. 9B).

Through the above steps, the transistor 217 and the capacitor 219 can be formed over the substrate 402. Note that in the manufacturing process in this embodiment, the transistor and the capacitor can be formed at the same time by the first to sixth patterning, namely, with six masks.

In this embodiment, the conductivity of the oxide semiconductor film 408c is increased by diffusing hydrogen contained in the insulating film 414 into the oxide semiconductor film 408c; however, the conductivity of the oxide semiconductor film 408c may be increased by covering the oxide semiconductor film 408a with a mask and adding impurities, typically, hydrogen, boron, phosphorus, tin, antimony, a rare gas element, alkali metal, alkaline earth metal, or the like to the oxide semiconductor film 408c. Hydrogen, boron, phosphorus, tin, antimony, a rare gas element, or the like may be added to the oxide semiconductor film 408c by an ion doping method, an ion implantation method, or the like. Alkali metal, alkaline earth metal, or the like may be added to the oxide semiconductor film 408c by a method in which the oxide semiconductor film 408c is exposed to a solution containing the impurity. Alternatively, the oxide semiconductor film 408c may be subjected to treatment in a plasma atmosphere containing hydrogen and argon to introduce hydrogen.

Next, description is made on the element portion over the substrate 442 facing the substrate 402. Note that the element portion over the substrate 442 refers to a region sandwiched between the substrate 442 and the alignment film 452.

Figure 10A:
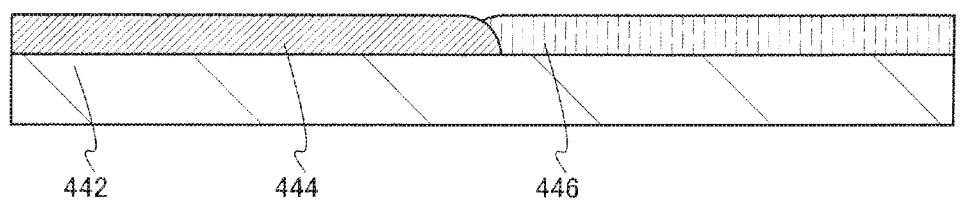
FIGS. 10A to 10C are cross-sectional views illustrating one mode of a method for manufacturing the semiconductor device.

First, the substrate 442 is prepared. For materials of the substrate 442, the materials that can be used for the substrate 402 can be referred to. Then, the light-blocking film 444 and the coloring film 446 are formed over the substrate 442 (see FIG. 10A).

The light-blocking film 444 and the coloring film 446 each are formed in a desired position with any of various materials by a printing method, an inkjet method, an etching method using a photolithography technique, or the like.

Figure 10B:
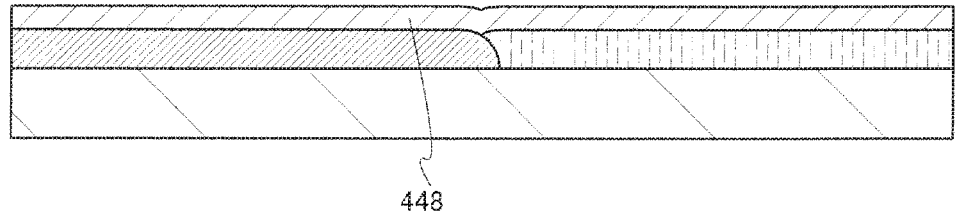

Then, the insulating film 448 is formed over the light-blocking film 444 and the coloring film 446 (see FIG. 10B).

For the insulating film 448, an organic insulating film of an acrylic resin, an epoxy resin, polyimide, or the like can be used. With the insulating film 448, an impurity or the like contained in the coloring film 446 can be prevented from diffusing into the liquid crystal layer 420 side, for example. Note that the insulating film 448 is not necessarily provided.

Figure 10C:
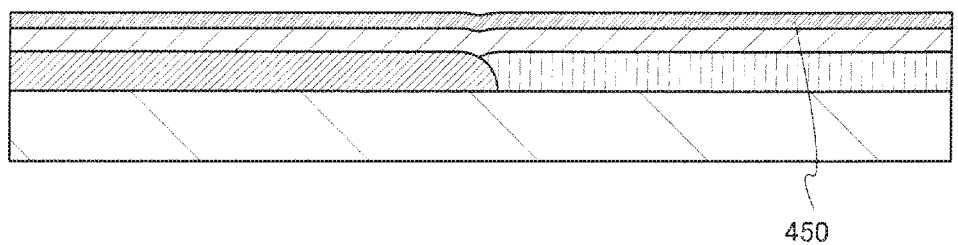

Next, the conductive film 450 is formed over the insulating film 448 (see FIG. 10C). For materials of the conductive film 450, the materials that can be used for the conductive film 415 can be referred to.

Through the above steps, the structure over the substrate 442 can be obtained.

Next, the alignment film 418 is formed over the substrate 402, specifically, over the insulating film 414 and the conductive film 416 formed over the substrate 402, and the alignment film 452 is formed over the substrate 442, specifically, over the conductive film 450 formed over the substrate 442. The alignment films 418 and 452 can be formed by a rubbing method, an optical alignment method, or the like. After that, the liquid crystal layer 420 is formed between the substrate 402 and the substrate 442. The liquid crystal layer 420 can be formed by a dispenser method (a dropping method), or an injecting method by which a liquid crystal is injected using a capillary phenomenon after the substrate 402 and the substrate 442 are bonded to each other.

With use of colored light as a backlight, a MEMS shutter may be driven by a time-sequential method. In that case, the alignment film, the liquid crystal element, the coloring film, and the like over the conductive film 416 are not necessary.

Figure 5:
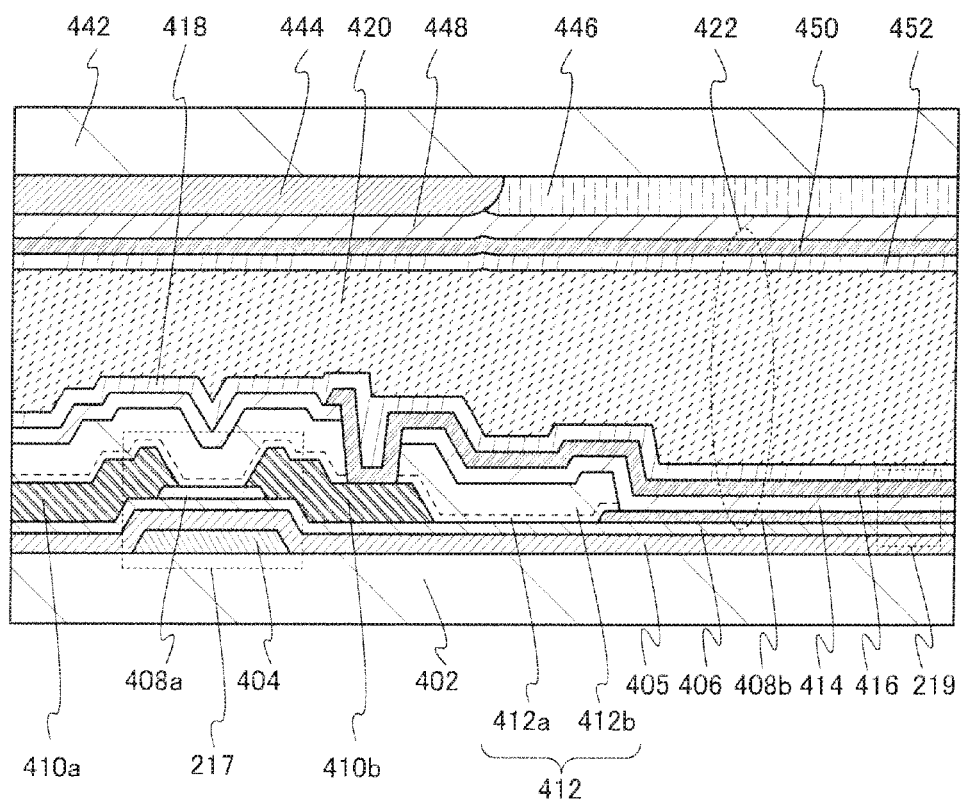
FIG. 5 is a cross-sectional view illustrating one mode of a semiconductor device.

Through the above steps, the semiconductor device illustrated in FIG. 5 can be manufactured.

A structure in which the transistor 218 is provided below the transistor 217 and the capacitor 219, which are semiconductor devices in the control circuit 200, will be described with reference to FIG. 17. The transistor 218 is described in detail below.

Figure 17:
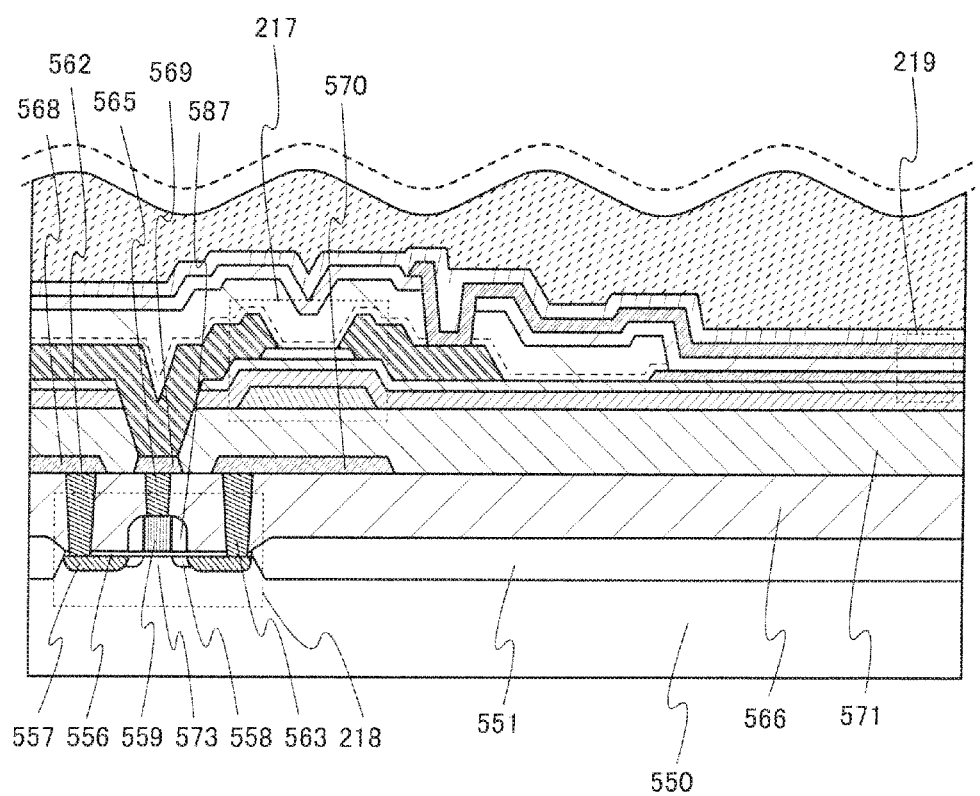
FIG. 17 is a cross-sectional view illustrating one mode of a semiconductor device.

FIG. 17 is a cross-sectional view of the structure in which the transistor 218 is provided below the transistor 217 and the capacitor 219. In a semiconductor device illustrated in FIG. 17, the transistor 218 using a material other than an oxide semiconductor is provided in the lower part, while the transistor 217 and the capacitor 219 using an oxide semiconductor are provided in the upper part. Although the transistor 218 is an n-channel transistor here, it may be a p-channel transistor. In particular, the transistor 218 can easily have p-type conductivity.

As illustrated in FIG. 17, the transistor 218 is formed on a substrate 550. The substrate 550 can be similar to the substrate 402.

The transistor 218 is electrically isolated from another transistor by an element isolation insulating film 551. The element isolation insulating film 551 can be formed by a local oxidation of silicon (LOCOS) method, a trench isolation method, or the like. Note that a silicon on insulator (SOI) type semiconductor substrate may be used as the substrate 550. In that case, a semiconductor layer may be divided by etching into elements for isolation.

The transistor 218 includes a high-concentration impurity region 557, a low-concentration impurity region 558, a gate electrode 559, and a gate insulating film 556 provided between the substrate 550 and the gate electrode 559. A sidewall insulating film 587 is formed around the gate electrode 559.

An insulating film 566 is formed on the transistor 218. The insulating film 566 includes an opening, and a wiring 562 and a wiring 563 are formed in the opening so as to be in contact with the high-concentration impurity region 557. A wiring 565 is formed in contact with the gate electrode 559.

The wiring 562 is electrically connected to a wiring 568 formed over the insulating film 566, the wiring 563 is electrically connected to a wiring 570 formed over the insulating film 566, and the wiring 565 is electrically connected to a wiring 569 formed over the insulating film 566.

An insulating film 571 is formed over the wirings 568 to 570. The transistor 217 including an oxide semiconductor is formed over the insulating film 571. The insulating film 571 includes an opening, and in the opening, the wiring 569 is electrically connected to one of the conductive films 410a and 410b serving as a source electrode and a drain electrode of the transistor 217.

Figure 18:
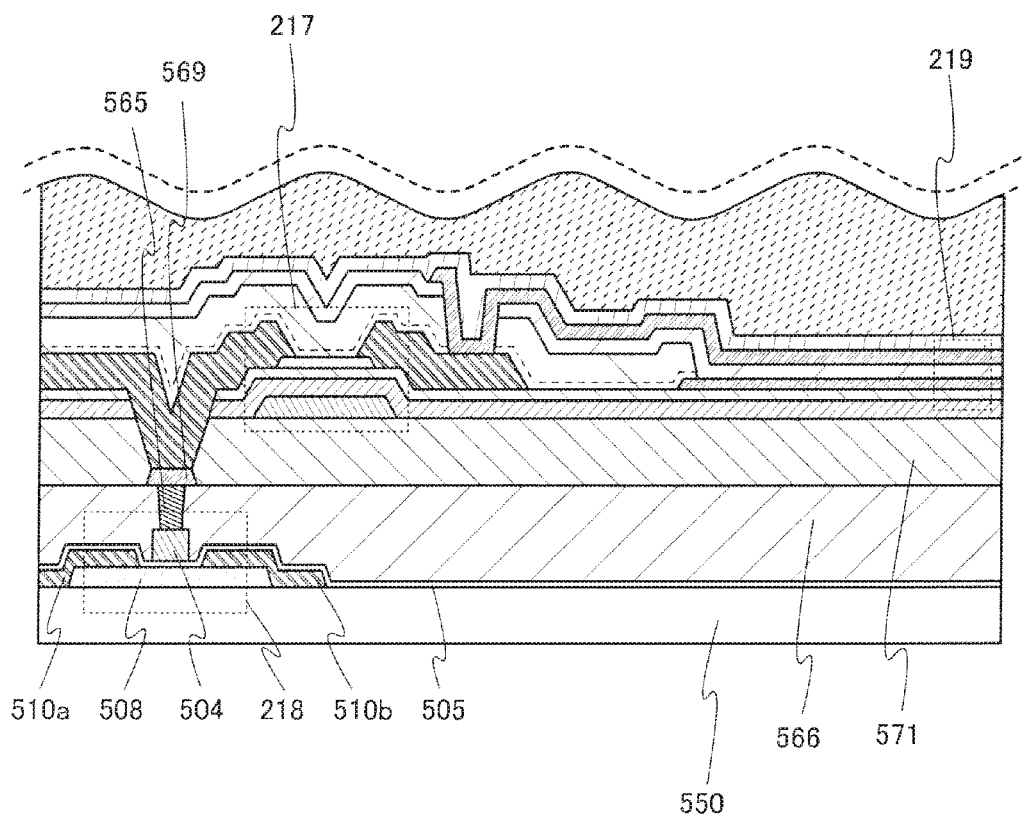
FIG. 18 is a cross-sectional view illustrating one mode of a semiconductor device.

As illustrated in FIG. 18, the transistor 218 may include an oxide semiconductor in a channel region. The oxide semiconductor of the transistor 218 may be a CAAC-OS film, and the oxide semiconductor of the transistor 217 may be a microcrystalline oxide semiconductor film. Note that the materials of the transistor 217 described above can be referred to for the materials of an oxide semiconductor film 508, conductive films 510a and 510b serving as a source electrode and a drain electrode, a gate insulating film 505, a gate electrode 504, and the like of the transistor 218 including an oxide semiconductor.

When the transistor 217 and the capacitor 219 are thus stacked over the transistor 218, a miniaturized display device occupying a small area can be manufactured.

This embodiment can be combined with any of the other embodiments in this specification as appropriate.

Embodiment 2

Described in this embodiment are modified examples of the transistor 217 and the capacitor 219 shown in Embodiment 1.

Modified Example 1: Transistor

Figure 11A:
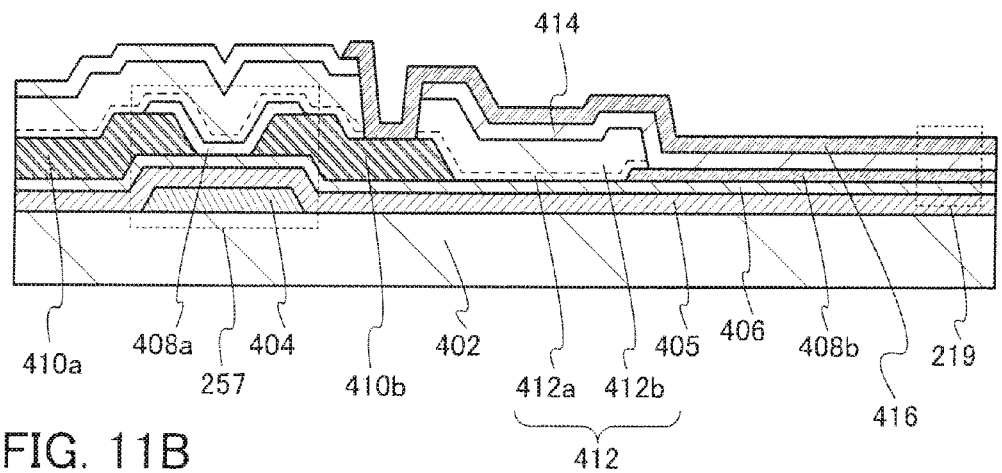
FIGS. 11A and 11B are cross-sectional views each illustrating one mode of a transistor.

In FIG. 11A, the oxide semiconductor film 408a of the transistor 217 shown in Embodiment 1 is connected to the conductive films 410a and 410b in a manner different from that illustrated in FIG. 5. This modified example shows a bottom-contact transistor 257.

Figure 11B:
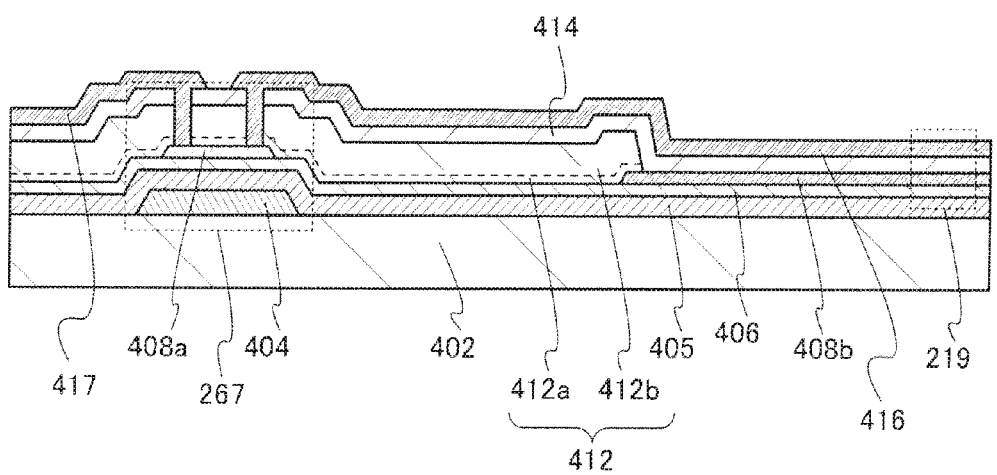

A transistor 267 illustrated in FIG. 11B does not include the conductive films 410a and 410b which serves as the source electrode and the drain electrode of the transistor 217 shown in Embodiment 1. Instead, openings are formed in the insulating films 412 and 414, and the conductive film 416 and a conductive film 417 serving as a source electrode and a drain electrode are formed so as to be in contact with the oxide semiconductor film 408a through the openings. Note that the conductive film 416 also serves as one electrode of the capacitor 219.

Modified Example 2: Base Insulating Film

In the transistor 217 described in Embodiment 1, a base insulating film can be provided between the substrate 402 and the gate electrode 404 as necessary. Examples of a material of the base insulating film include silicon oxide, silicon oxynitride, silicon nitride, silicon nitride oxide, gallium oxide, hafnium oxide, yttrium oxide, aluminum oxide, and aluminum oxynitride. Note that when silicon nitride, gallium oxide, hafnium oxide, yttrium oxide, aluminum oxide, or the like is used for the base insulating film, it is possible to suppress diffusion of impurities such as alkali metal, water, and hydrogen into the oxide semiconductor film 408a from the substrate 402.

The base insulating film can be formed by a sputtering method, a CVD method, or the like.

Modified Example 3: Gate Insulating Film

In the transistor 217 described in Embodiment 1, the layered structure of the insulating film serving as the gate insulating film can be changed as necessary.

Figure 12A:
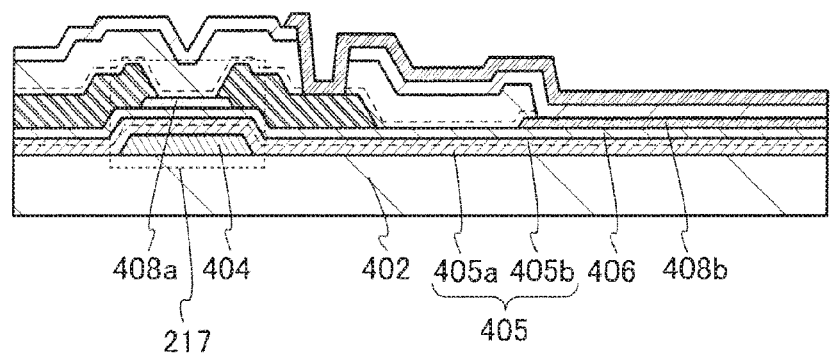
FIGS. 12A and 12B are cross-sectional views each illustrating one mode of a transistor.

As illustrated in FIG. 12A, the gate insulating film has a layered structure in which the insulating film 405 and the insulating film 406 are stacked in this order from the gate electrode 404 side.

When the insulating film 405 formed using a nitride insulating film is provided on the gate electrode 404 side, an impurity, typically hydrogen, nitrogen, alkali metal, alkaline earth metal, or the like, can be prevented from moving from the gate electrode 404 to the oxide semiconductor film 408a.

Furthermore, the insulating film 406 formed using an oxide insulating film is provided on the oxide semiconductor film 408a side, thereby reducing the density of defect states at the interface between the insulating film 406 and the oxide semiconductor film 408a. Consequently, a transistor whose electrical characteristics are hardly degraded can be obtained. Note that like the insulating film 412b, the insulating film 406 is more preferably formed using an oxide insulating film containing oxygen at a higher proportion than the stoichiometric composition, in which case the density of defect states at the interface between the insulating film 406 and the oxide semiconductor film 408a can be further reduced.

As illustrated in FIG. 12A, the insulating film 405 can have a layered structure in which a nitride insulating film 405a with few defects and a nitride insulating film 405b with a high blocking property against hydrogen are stacked in this order from the gate electrode 404 side. When the nitride insulating film 405a with few defects is provided in the gate insulating film 405, the withstand voltage of the gate insulating film can be improved. In addition, when the nitride insulating film 405b with a high blocking property against hydrogen is provided, hydrogen can be prevented from moving from the gate electrode 404 and the nitride insulating film 405a to the oxide semiconductor film 408a.

An example of a method for manufacturing the nitride insulating films 405a and 405b illustrated in FIG. 12A will be described below. First, as the nitride insulating film 405a, a silicon nitride film with few defects is formed by a plasma CVD method using a mixed gas of silane, nitrogen, and ammonia as a source gas. Then, as the nitride insulating film 405b, a silicon nitride film which has a low hydrogen concentration and can block hydrogen is formed by changing the source gas to a mixed gas of silane and nitrogen. Such a formation method makes it possible to form the gate insulating film having a stack of nitride insulating films with few defects and a blocking property against hydrogen.

Figure 12B:
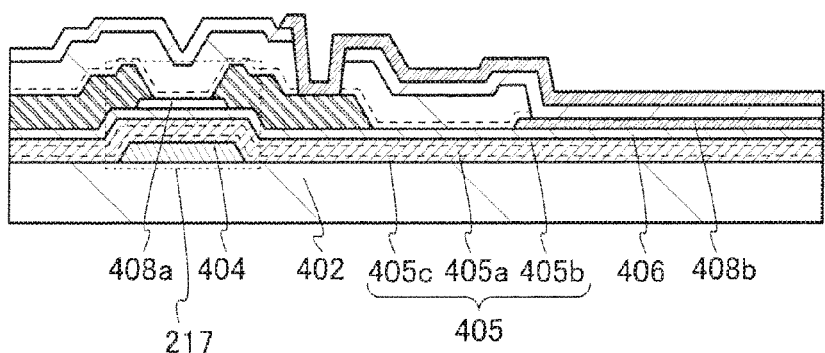

Alternatively, as illustrated in FIG. 12B, the insulating film 405 can have a layered structure in which a nitride insulating film 405c with a high blocking property against an impurity, the nitride insulating film 405a with few defects, and the nitride insulating film 405b with a high blocking property against hydrogen are stacked in this order from the gate electrode side. When the nitride insulating film 405c with a high blocking property against an impurity is provided in the insulating film 405, an impurity, typically hydrogen, nitrogen, alkali metal, alkaline earth metal, or the like, can be prevented from moving from the gate electrode to the oxide semiconductor film 408a.

An example of a method for manufacturing the nitride insulating films 405a, 405b, and 405c illustrated in FIG. 12B will be described below. First, as the nitride insulating film 405c, a silicon nitride film with a high blocking property against an impurity is formed by a plasma CVD method using a mixed gas of silane, nitrogen, and ammonia as a source gas. Next, a silicon nitride film with few defects is formed as the nitride insulating film 405a by increasing the flow rate of ammonia. Then, as the nitride insulating film 405b, a silicon nitride film which has a low hydrogen concentration and can block hydrogen is formed by changing the source gas to a mixed gas of silane and nitrogen. Such a formation method makes it possible to form the insulating film 405 having a stack of nitride insulating films with few defects and a blocking property against an impurity.

Modified Example 4: A Pair of Electrodes

Description is made on the materials for the conductive films 410a and 410b of the transistor 217 shown in Embodiment 1.

Figure 13:
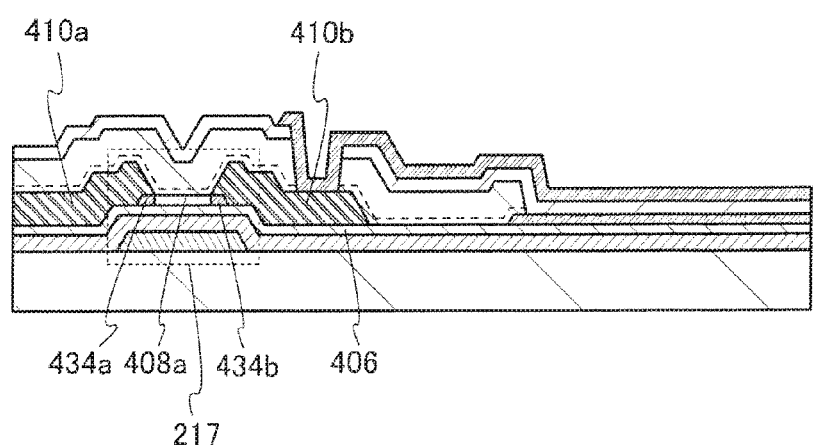
FIG. 13 is a cross-sectional view illustrating one mode of a transistor.

For the conductive films 410a and 410b provided in the transistor 217 shown in Embodiment 1, it is preferable to use a conductive material which is easily bonded to oxygen, such as tungsten, titanium, aluminum, copper, molybdenum, chromium, or tantalum, or an alloy thereof. As a result, oxygen contained in the oxide semiconductor film 408a is bonded to the conductive material contained in the conductive films 410a and 410b, so that an oxygen deficient region is formed in the oxide semiconductor film 408a. In some cases, part of constituent elements of the conductive material that forms the conductive films 410a and 410b is mixed into the oxide semiconductor film 408a. Consequently, as illustrated in FIG. 13, low-resistance regions 434a and 434b are formed in the vicinity of regions of the oxide semiconductor film 408a which are in contact with the conductive films 410a and 410b. The low-resistance regions 434a and 434b are formed between the insulating film 406 and the conductive films 410a and 410b so as to be in contact with the conductive films 410a and 410b. Since the low-resistance regions 434a and 434b have high conductivity, contact resistance between the oxide semiconductor film 408a and the conductive films 410a and 410b can be reduced, increasing the on-state current of the transistor.

The conductive films 410a and 410b may each have a layered structure of the conductive material which is easily bonded to oxygen and a conductive material which is not easily bonded to oxygen, such as titanium nitride, tantalum nitride, or ruthenium. Such a layered structure prevents oxidization of the conductive films 410a and 410b at the interface between the conductive films 410a and 410b and the oxide semiconductor film 408a, thereby inhibiting an increase in the resistance of the conductive films 410a and 410b.

Modified Example 5: Oxide Semiconductor Film

In the method for manufacturing the transistor 217 described in Embodiment 1, after the conductive films 410a and 410b are formed, the oxide semiconductor film 408a may be exposed to plasma generated in an oxygen atmosphere, so that oxygen may be supplied to the oxide semiconductor film 408a. Examples of the oxidizing gas include oxygen, ozone, dinitrogen monoxide, and nitrogen dioxide. Furthermore, in the plasma treatment, the oxide semiconductor film 408a is preferably exposed to plasma generated with no bias applied to the substrate 402 side. Consequently, the oxide semiconductor film 408a can be supplied with oxygen without being damaged, resulting in a reduction in the amount of oxygen vacancies in the oxide semiconductor film 408a. Moreover, impurities, e.g., halogen such as fluorine or chlorine remaining on the surface of the oxide semiconductor film 408a due to the etching treatment can be removed.

Modified Example 6: Oxide Semiconductor Film

In the transistor 217 described in Embodiment 1, the oxide semiconductor film can have a layered structure as necessary.

Figure 14:
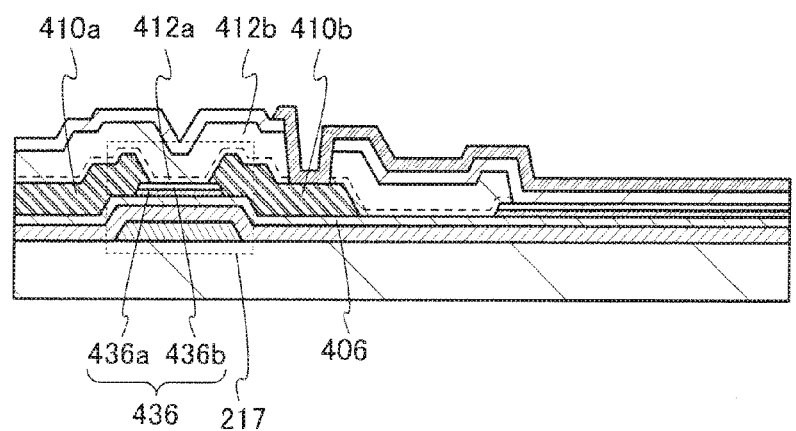
FIG. 14 is a cross-sectional view illustrating one mode of a transistor.

In the transistor illustrated in FIG. 14, a multilayer film 436 including an oxide semiconductor film is formed between the insulating film 406 and the conductive films 410a and 410b.

The multilayer film 436 includes an oxide semiconductor film 436a and an oxide film 436b. That is, the multilayer film 436 has a two-layer structure. Part of the oxide semiconductor film 436a serves as a channel region. Furthermore, the insulating film 412a is formed in contact with the multilayer film 436, and the oxide film 436b is formed in contact with the insulating film 412a. That is, the oxide film 436b is provided between the oxide semiconductor film 436a and the insulating film 412a.

The oxide film 436b contains one or more elements which form the oxide semiconductor film 436a. Since the oxide film 436b contains one or more elements which form the oxide semiconductor film 436a, interface scattering is unlikely to occur at the interface between the oxide semiconductor film 436a and the oxide film 436b. Thus, the transistor can have a high field-effect mobility because the movement of carriers is not hindered at the interface.

The oxide film 436b is typically In—Ga oxide, In—Zn oxide, or In-M-Zn oxide (M is Al, Ti, Ga, Y, Zr, La, Ce, Nd, or Hf). The energy at the conduction band bottom of the oxide film 436b is closer to a vacuum level than that of the oxide semiconductor film 436a is, and typically, the difference between the energy at the conduction band bottom of the oxide film 436b and the energy at the conduction band bottom of the oxide semiconductor film 436a is any one of 0.05 eV or more, 0.07 eV or more, 0.1 eV or more, and 0.15 eV or more, and any one of 2 eV or less, 1 eV or less, 0.5 eV or less, and 0.4 eV or less. That is, the difference between the electron affinity of the oxide film 436b and the electron affinity of the oxide semiconductor film 436a is any one of 0.05 eV or more, 0.07 eV or more, 0.1 eV or more, and 0.15 eV or more, and any one of 2 eV or less, 1 eV or less, 0.5 eV or less, and 0.4 eV or less.

The oxide film 436b preferably contains In because carrier mobility (electron mobility) can be increased.

When the oxide film 436b contains a larger amount of Al, Ti, Ga, Y, Zr, La, Ce, Nd, or Hf in an atomic ratio than the amount of In in an atomic ratio, the following effects can be obtained in some cases: (1) increase in the energy gap of the oxide film 436b; (2) decrease in the electron affinity of the oxide film 436b; (3) blocking of an impurity from the outside; (4) higher insulating property than that of the oxide semiconductor film 436a; and (5) less oxygen vacancies in the oxide film 436b containing a larger amount of Al, Ti, Ga, Y, Zr, La, Ce, Nd, or Hf in an atomic ratio than the amount of In in an atomic ratio because Al, Ti, Ga, Y, Zr, La, Ce, Nd, or Hf is a metal element which is strongly bonded to oxygen.

When the oxide film 436b includes an In-M-Zn oxide, the proportion of In and the proportion of M, not taking Zn and O into consideration, are preferably less than 50 atomic % and greater than or equal to 50 atomic %, respectively, more preferably less than 25 atomic % and greater than or equal to 75 atomic %, respectively.

In the case where each of the oxide semiconductor film 436a and the oxide film 436b is In-M-Zn oxide film (M is Al, Ti, Ga, Y, Zr, La, Ce, Nd, or Hf), the proportion of M atoms (M is Al, Ti, Ga, Y, Zr, La, Ce, Nd, or Hf) in the oxide film 436b is higher than that in the oxide semiconductor film 436a. Typically, the proportion of M in the oxide film 436b is 1.5 or more times, preferably twice or more, and more preferably three or more times as high as that in the oxide semiconductor film 436a.

In the case where the oxide semiconductor film 436a is an In-M-Zn oxide (M is Al, Ti, Ga, Y, Zr, La, Ce, Nd, or Hf, and In:M:Zn=$x_1$:$y_1$:$z_1$ [atomic ratio]) and the oxide film 436b is an In-M-Zn oxide (M is Al, Ti, Ga, Y, Zr, La, Ce, Nd, or Hf, and In:M:Zn=$x_2$:$y_2$:$z_2$ [atomic ratio]), $y_1/x_1$ is greater than $y_2/x_2$, or preferably $y_1/x_1$ is 1.5 or more times as much as $y_2/x_2$. More preferably, $y_1/x_1$ is twice or more as much as $y_2/x_2$, or still more preferably $y_1/x_1$ is three or more times as much as $y_2/x_2$. In this case, it is preferable that in the oxide semiconductor film, $y_2$ be greater than or equal to $x_2$ because a transistor including the oxide semiconductor film can have stable electrical characteristics. However, when $y_2$ is larger than or equal to three times $x_2$, the field-effect mobility of the transistor including the oxide semiconductor film is reduced. Accordingly, $y_2$ is preferably smaller than three times $x_2$.

In the case where the oxide semiconductor film 436a is an In-M-Zn oxide film and a target having the atomic ratio of metal elements of In:M:Zn=$x_1$:$y_1$:$z_1$ is used for forming the oxide semiconductor film 436a, $x_1/y_1$ is preferably greater than or equal to ⅓ and less than or equal to 6, more preferably greater than or equal to 1 and less than or equal to 6, and $z_1/y_1$ is preferably greater than or equal to ⅓ and less than or equal to 6, more preferably greater than or equal to 1 and less than or equal to 6. Note that when $z_1/y_1$ is greater than or equal to 1 and less than or equal to 6, a CAAC-OS film is easily formed as the oxide semiconductor film 436a. Typical examples of the atomic ratio of the metal elements of the target are In:M:Zn=1:1:1 and In:M:Zn=3:1:2.

In the case where the oxide film 436b is an In-M-Zn oxide film, when a target used for forming the oxide film 436b has an atomic ratio of metal elements of In:M:Zn=$x_2$:$y_2$:$z_2$, $x_2/y_2 < x_1/y_1$ is satisfied and $z_2/y_2$ is preferably greater than or equal to ⅓ and less than or equal to 6, more preferably greater than or equal to 1 and less than or equal to 6. Note that when $z_2/y_2$ is greater than or equal to 1 and less than or equal to 6, a CAAC-OS film is easily formed as the oxide film 436b. Typical examples of the atomic ratio of the metal elements of the target are In:M:Zn=1:3:2 and In:M:Zn 1:3:3.

The oxide film 436b also serves as a film which relieves damage to the oxide semiconductor film 436a at the time of forming the insulating film 412b later.

The oxide film 436b has a thickness of 3 nm to 100 nm, preferably 3 nm to 50 nm.

The oxide film 436b may have a non-single-crystal structure like the oxide semiconductor film 436a, for example. The non-single crystal structure includes a c-axis aligned crystalline oxide semiconductor (CAAC-OS), a polycrystalline structure, a microcrystalline structure, or an amorphous structure, for example.

Note that the oxide semiconductor film 436a and the oxide film 436b may each be a mixed film including two or more of the following: a region having an amorphous structure, a region having a microcrystalline structure, a region having a polycrystalline structure, a CAAC-OS region, and a region having a single-crystal structure. In some cases, the mixed film has a layered structure of two or more of a region having an amorphous structure, a region having a microcrystalline structure, a region having a polycrystalline structure, a CAAC-OS region, and a region having a single-crystal structure.

Here, the oxide film 436b is provided between the oxide semiconductor film 436a and the insulating film 412a. Hence, if trap states are formed between the oxide film 436b and the insulating film 412a owing to impurities and defects, electrons flowing in the oxide semiconductor film 436a are less likely to be captured by the trap states because there is a distance between the trap states and the oxide semiconductor film 436a. Accordingly, the amount of on-state current of the transistor can be increased, and the field-effect mobility can be increased. When the electrons are captured by the trap states, the electrons become negative fixed charges. As a result, the threshold voltage of the transistor varies. However, the distance between the oxide semiconductor film 436a and the trap states reduces capture of the electrons by the trap states, and accordingly reduces variation in threshold voltage.

Impurities from the outside can be blocked by the oxide film 436b, which results in a reduction in the amount of impurities moving from the outside to the oxide semiconductor film 436a. In addition, an oxygen vacancy is less likely to be formed in the oxide film 436b. It is thus possible to reduce the impurity concentration and the amount of oxygen vacancies in the oxide semiconductor film 436a.

Note that the oxide semiconductor film 436a and the oxide film 436b are not formed by simply stacking each film, but are formed to form a continuous junction (here, in particular, a structure in which the energy of the bottom of the conduction band is changed continuously between each film). In other words, a layered structure is formed such that there exist no impurities forming a defect state such as a trap center or a recombination center at the interface between the oxide semiconductor film 436a and the oxide film 436b. If an impurity exists between the oxide semiconductor film 436a and the oxide film 436b which are stacked, the continuity of the energy band is damaged, and the carrier is captured or recombined at the interface and then disappears.

To form the continuous junction, each film needs to be stacked successively without exposure to the atmosphere using a multi-chamber deposition apparatus (sputtering apparatus) including a load lock chamber. Each chamber in the sputtering apparatus is preferably subjected to high vacuum evacuation (to a vacuum of about $5 \times 10^4$ Pa to $1 \times 10^{-4}$ Pa) with use of a suction vacuum evacuation pump such as a cryopump so that water or the like, which is an impurity for the oxide semiconductor film, is removed as much as possible. Alternatively, a turbo-molecular pump is preferably used in combination with a cold trap to prevent backflow of a gas, particularly a gas containing carbon or hydrogen into the chamber through an evacuation system.

In FIG. 14, the multilayer film 436 has a two-layer structure of the oxide semiconductor film 436a and the oxide film 436b; however the multilayer film 436 may have a three-layer structure in which a film similar to the oxide film 436b is further provided between the insulating film 406 and the oxide semiconductor film 436a. In this case, the thickness of the oxide film provided between the insulating film 406 and the oxide semiconductor film 436a is preferably less than that of the oxide semiconductor film 436a. When the thickness of the oxide film is greater than or equal to 1 nm and less than or equal to 5 nm, preferably greater than or equal to 1 nm and less than or equal to 3 nm, the amount of change in the threshold voltage of the transistor can be reduced.

Modified Example 7: Oxide Semiconductor Film

The structure of the multilayer film including the oxide semiconductor film shown in modified example 6 can be changed as appropriate.

Figure 15:
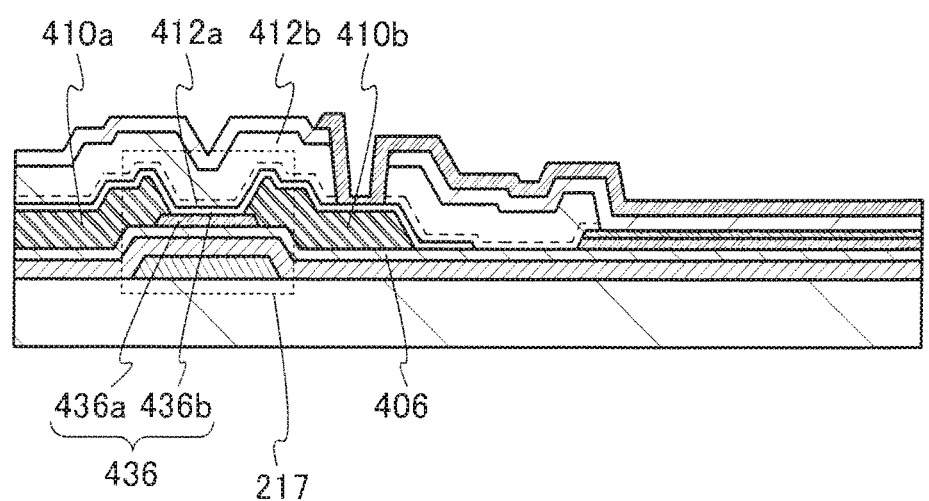
FIG. 15 is a cross-sectional view illustrating one mode of a transistor.

As illustrated in FIG. 15, the multilayer film 436 including an oxide semiconductor film is formed between the insulating film 406 and the insulating film 412a.

The multilayer film 436 includes the oxide semiconductor film 436a formed between the insulating film 406 and the conductive films 410a and 410b, and the oxide film 436b formed over the oxide semiconductor film 436a and the conductive films 410a and 410b. Part of the oxide semiconductor film 436a serves as a channel region. Furthermore, the insulating film 412a is formed in contact with the multilayer film 436, and the oxide film 436b is formed in contact with the insulating film 412a. That is, the oxide film 436b is provided between the oxide semiconductor film 436a and the insulating film 412a.

The transistor 217 shown in this modified example has a lower contact resistance between the oxide semiconductor film 436a and the conductive films 410a and 410b and an increased on-state current as compared to the transistor in modified example 6 because the conductive films 410a and 410b are in contact with the oxide semiconductor film 436a.

Furthermore, since the conductive films 410a and 410b are in contact with the oxide semiconductor film 436a in the transistor 217 in this modified example, the thickness of the oxide film 436b can be increased without increase of the contact resistance between the oxide semiconductor film 436a and the conductive films 410a and 410b. Thus, it is possible to inhibit formation of a trap state, which occurs due to plasma damage at the time of forming the insulating film 412b, mixing of a constituent element of the insulating films 412a and 412b, or the like, in the vicinity of the interface between the oxide semiconductor film 436a and the oxide film 436b. That is, the transistor in this modified example can achieve both improvement of on-state current and reduction in variation in threshold voltage.

Modified Example 8: Structure of Transistor

The transistor 217 described in Embodiment 1 can include a plurality of gate electrodes facing each other with an oxide semiconductor film interposed therebetween as necessary.

Figure 16:
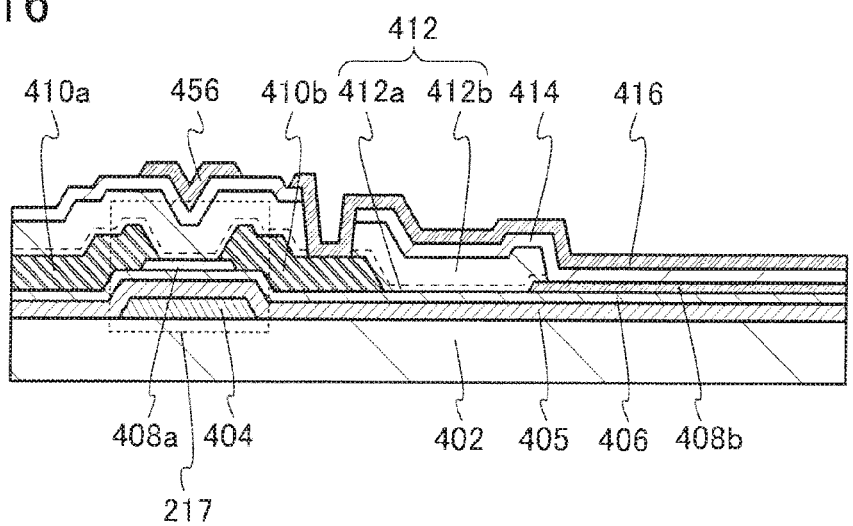
FIG. 16 is a cross-sectional view illustrating one mode of a transistor.

The transistor 217 illustrated in FIG. 16 includes the gate electrode 404 over the substrate 402. The transistor 217 also includes the insulating films 405 and 406 formed over the substrate 402 and the gate electrode 404, the oxide semiconductor film 408a overlapping with the gate electrode 404 with the insulating films 405 and 406 interposed therebetween, and the conductive films 410a and 410b in contact with the oxide semiconductor film 408a. Over the insulating film 406, the oxide semiconductor film 408a, and the conductive films 410a and 410b, the insulating film 412 including a stack of the insulating films 412a and 412b, and the insulating film 414 are formed. A conductive film 456 is provided to overlap with the oxide semiconductor film 408a with the insulating films 412 and 414 interposed therebetween.

The gate electrode 404 faces the conductive film 456 with the oxide semiconductor film 408a interposed therebetween. The conductive film 456 serves as a gate electrode. The conductive film 456 is preferably formed at the same time as the conductive film 416 to reduce the number of manufacturing steps.

The transistor 217 shown in this modified example includes the gate electrode 404 and the conductive film 456 which face each other with the oxide semiconductor film 408a interposed therebetween. The threshold voltage of the transistor 217 can be controlled by supplying different potentials to the gate electrode 404 and the conductive film 456.

The structures, methods, and the like described in this embodiment can be used as appropriate in combination with any of the structures, methods, and the like described in the other embodiments.

Embodiment 3

The semiconductor device of one embodiment of the present invention can be used in a sensor that can detect proximity or touch of an object (e.g., a capacitive, a resistive, a surface acoustic wave, an infrared, and an optical touch sensor) and a radiographic image detection device that can obtain a medical radiographic image. The semiconductor device of one embodiment of the present invention can also be applied to a variety of electronic devices (including game machines). Examples of electronic devices include a television device (also referred to as television or television receiver), a monitor of a computer or the like, a digital camera, a digital video camera, a digital photo frame, a mobile phone, a portable game machine, a portable information terminal, an audio reproducing device, a game machine (e.g., a pachinko machine or a slot machine), and a game console. Examples of these electronic devices are illustrated in FIGS. 19A to 19C.

Figure 19A:
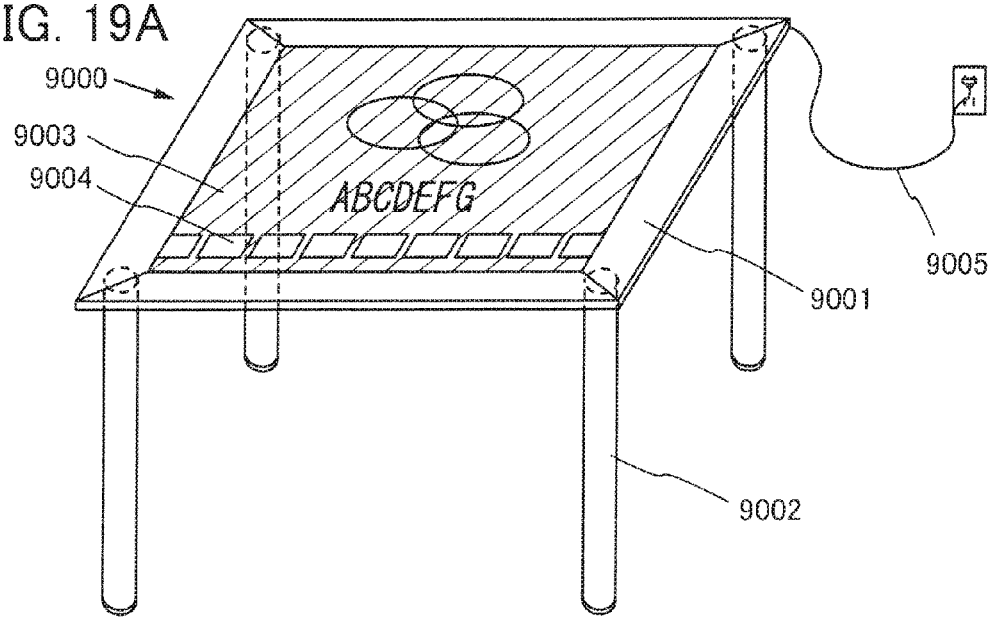
FIGS. 19A to 19C each illustrate an electronic device using a display device.
Figure 19B:
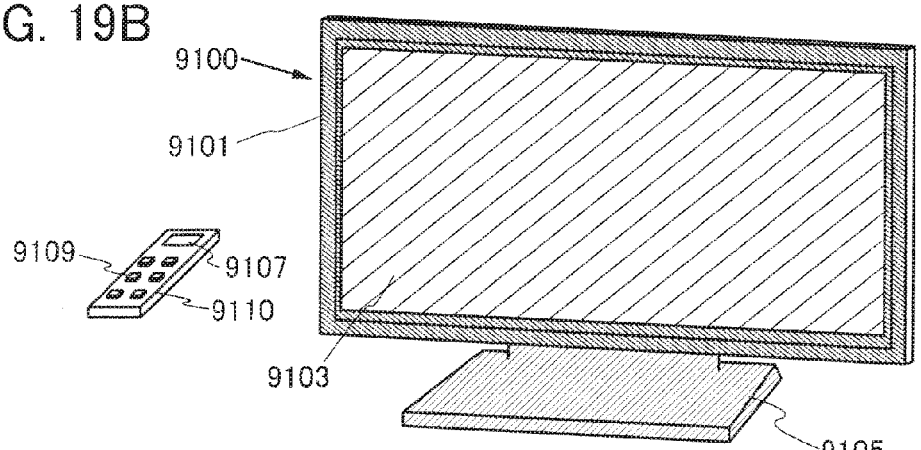
Figure 19C:
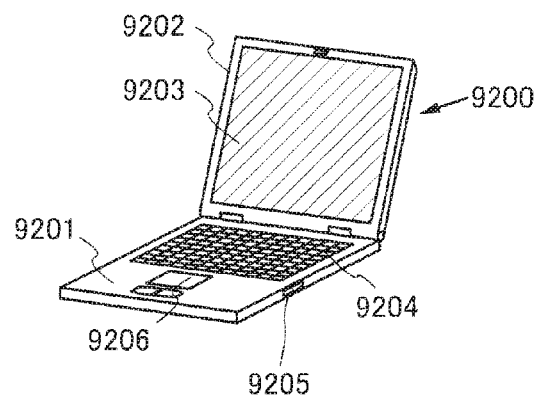

FIG. 19A illustrates a table 9000 including a display portion. In the table 9000, a display portion 9003 is incorporated in a housing 9001 and an image can be displayed on the display portion 9003. The housing 9001 is supported by four leg portions 9002. The housing 9001 also includes a power cord 9005 for supplying power.

The semiconductor device described in any of the above embodiments can be used for the display portion 9003; therefore, the display portion 9003 can have high display quality.

The display portion 9003 has a touch-input function. When a user touches displayed buttons 9004 which are displayed on the display portion 9003 of the table 9000 with his/her fingers or the like, the user can carry out operation of the screen and input of information. Furthermore, the table 9000 may be made to communicate with home appliances or control the home appliances, in which case the table 9000 may function as a control device which controls the home appliances by operation on the screen. For example, with use of a semiconductor device having an image sensor function, the display portion 9003 can have a touch-input function.

The screen of the display portion 9003 can also be placed perpendicular to a floor with a hinge provided for the housing 9001, in which case the table 9000 can also be used as a television device. When a television device having a large screen is set in a small room, an open space is reduced; however, when a display portion is incorporated in a table, a space in the room can be efficiently used.

FIG. 19B illustrates a television device 9100. In the television device 9100, a display portion 9103 is incorporated in a housing 9101 and an image can be displayed on the display portion 9103. Note that the housing 9101 is supported by a stand 9105 here.

The television device 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television device 9100 illustrated in FIG. 19B includes a receiver, a modem, and the like. With the use of the receiver, the television device 9100 can receive general TV broadcasts. Moreover, when the television device 9100 is connected to a communication network with or without wires via the modem, one-way (from a sender to a receiver) or two-way (between a sender and a receiver or between receivers) information communication can be performed.

The semiconductor device described in any of the above embodiments can be used in the display portions 9103 and 9107; therefore, the television device can have high display quality.

FIG. 19C illustrates a computer 9200, which includes a main body 9201, a housing 9202, a display portion 9203, a keyboard 9204, an external connection port 9205, a pointing device 9206, and the like.

The semiconductor device described in any of the above embodiments can be used for the display portion 9203; therefore, the computer 9200 can have high display quality.

Figure 20A:
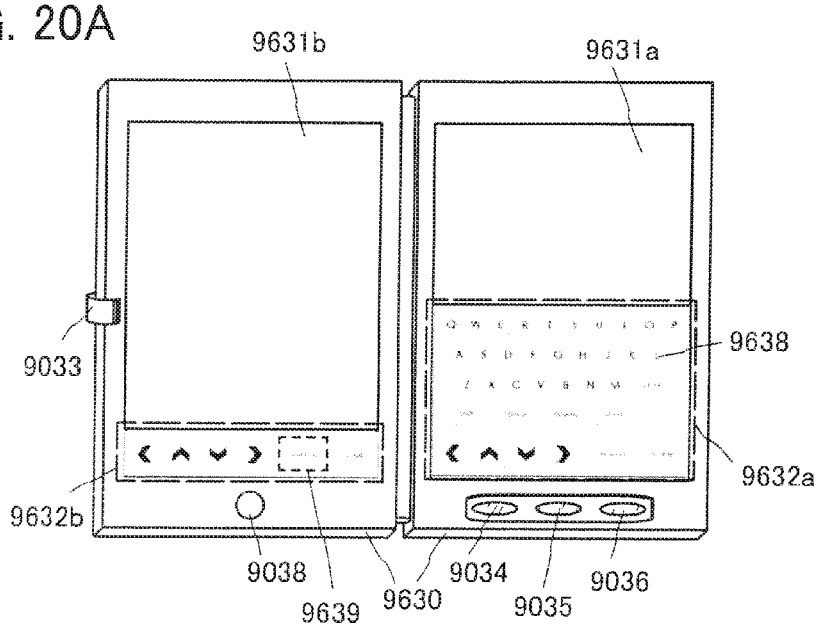
FIGS. 20A to 20C illustrate an electronic device using a display device.
Figure 20B:
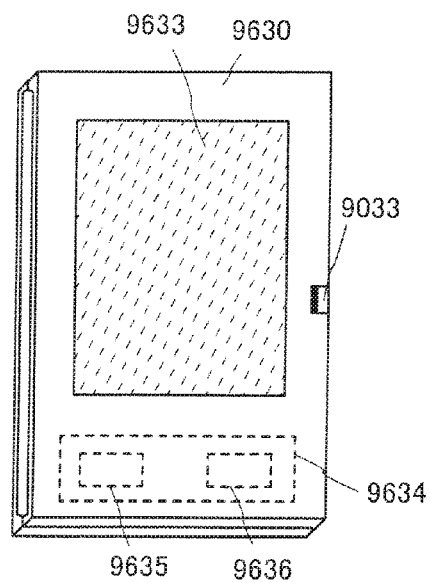

FIGS. 20A and 20B illustrate a tablet terminal that can be folded. In FIG. 20A, the tablet terminal is opened, and includes a housing 9630, a display portion 9631a, a display portion 9631b, a display-mode switching button 9034, a power button 9035, a power-saving-mode switching button 9036, a clip 9033, and an operation button 9038.

The semiconductor device described in any of the above embodiments can be used for the display portion 9631a and the display portion 9631b; therefore, the tablet terminal can have high display quality.

Part of the display portion 9631a can be a touch panel region 9632a, and data can be input by touching operation keys 9638 displayed. Although the display portion 9631a having a structure in which a half region in the display portion 9631a has only a display function and the other half region also has a touch panel function is illustrated as an example, the structure of the display portion 9631a is not limited thereto. The whole display portion 9631a may have a touch panel function. For example, a keyboard is displayed on the whole display portion 9631a so that the display portion 9631a serves as a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display-mode switching button 9034 can switch the display between portrait mode, landscape mode, and the like, and between monochrome display and color display, for example. With the button 9036 for switching to power-saving mode, the luminance of display can be optimized in accordance with the amount of external light at the time when the tablet terminal is in use, which is detected with an optical sensor incorporated in the tablet terminal. The tablet terminal may include another detection device such as a sensor for determining orientation (e.g., a gyroscope or an acceleration sensor) in addition to the optical sensor.

Although the display portion 9631a and the display portion 9631b have the same display area in FIG. 20A, one embodiment of the present invention is not limited to this structure. The display portion 9631a and the display portion 9631b may have different areas or different display quality. For example, one of them may display higher-definition images than the other.

The tablet terminal is closed in FIG. 20B. The tablet terminal includes the housing 9630, a solar cell 9633, and a charge and discharge control circuit 9634. FIG. 20B shows a structure in which the charge and discharge control circuit 9634 includes a battery 9635 and a DCDC converter 9636.

Since the tablet terminal is foldable, the housing 9630 can be closed when the tablet terminal is not used. As a result, the display portion 9631a and the display portion 9631b can be protected, which offers a tablet terminal having excellent durability and high reliability in terms of long-term use.

In addition, the tablet terminal illustrated in FIGS. 20A and 2B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

Figure 20C:
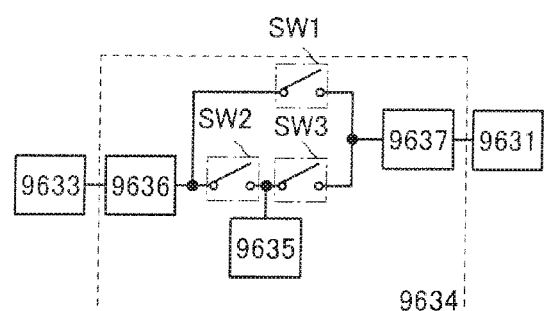

The structure and operation of the charge and discharge control circuit 9634 illustrated in FIG. 20B will be described with reference to a block diagram in FIG. 20C. FIG. 20C illustrates the solar cell 9633, the battery 9635, the DCDC converter 9636, a converter 9637, switches SW1 to SW3, and the display portion 9631. The battery 9635, the DCDC converter 9636, the converter 9637, and the switches SW1 to SW3 correspond to the charge and discharge control circuit 9634 illustrated in FIG. 20B.

First, description is made on an example of the operation in the case where power is generated by the solar cell 9633 using external light. The voltage of power generated by the solar cell 9633 is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. When display on the display portion 9631 is not performed, the switch SW1 is turned off and the switch SW2 is turned on so that the battery 9635 can be charged.

Note that the solar cell 9633 is described as an example of a power generation means; however, without limitation thereon, the battery 9635 may be charged using another power generation means such as a piezoelectric element or a thermoelectric conversion element (Peltier element). For example, the battery 9635 may be charged with a non-contact power transmission module which is capable of charging by transmitting and receiving power by wireless (without contact), or another charge means used in combination.

The structures, methods, and the like described in this embodiment can be used as appropriate in combination with any of the structures, methods, and the like described in the other embodiments.

This application is based on Japanese Patent Application serial No. 2013-088181 filed with Japan Patent Office on Apr. 19, 2013, the entire contents of which are hereby incorporated by reference.

What is claimed is:

1. A semiconductor device comprising:
a first transistor comprising a first semiconductor film;
a second transistor comprising a second semiconductor film including an oxide semiconductor;
a capacitor; and
a MEMS shutter,
wherein:
one of a source and a drain of the first transistor is electrically connected to the MEMS shutter, and
a gate of the first transistor, one of a source and a drain of the second transistor, and one terminal of the capacitor are electrically connected to each other.

2. The semiconductor device according to claim 1, wherein:
the MEMS shutter comprises:
a first layer having an opening;
a second layer configured to block light passing through the opening; and
an actuator configured to move the second layer, and the MEMS shutter is capable of moving to block light.

3. The semiconductor device according to claim 2, wherein the actuator is electrically connected to the one of source and drain of the first transistor.

4. The semiconductor device according to claim 1, wherein the semiconductor device is applied to an electronic device selected from a television, a computer, a camera, a phone, a game machine, and an audio reproducing device.

5. A semiconductor device comprising:
a first transistor comprising a first semiconductor film;
a second transistor comprising a second semiconductor film including an oxide semiconductor;
a capacitor;
a display element; and
a MEMS shutter,
wherein:
one of a source and a drain of the first transistor is electrically connected to the MEMS shutter,
a gate of the first transistor, one of a source and a drain of the second transistor, and one terminal of the capacitor are electrically connected to each other, and
the MEMS shutter is configured to control a display of the display element.

6. The semiconductor device according to claim 5, wherein the display element is a liquid crystal element.

7. The semiconductor device according to claim 5, wherein:
the MEMS shutter comprises:
a first layer having an opening overlapping with part of the display element;
a second layer configured to block light passing through the opening; and
an actuator configured to move the second layer, and the MEMS shutter is capable of moving to block light.

8. The semiconductor device according to claim 7, wherein the actuator is electrically connected to the one of source and drain of the first transistor.

9. The semiconductor device according to claim 5, wherein the semiconductor device is applied to an electronic device selected from a television, a computer, a camera, a phone, a game machine, and an audio reproducing device.

10. The semiconductor device according to claim 1, wherein a node, at which the first transistor, the second transistor, and the capacitor are connected, is in a floating state, when the second transistor is turned off.

11. The semiconductor device according to claim 1, wherein the first semiconductor film includes a semiconductor material different from the oxide semiconductor.

12. The semiconductor device according to claim 1, wherein the oxide semiconductor contains at least one of In, Ga, and Zn.

13. The semiconductor device according to claim 5, wherein a node, at which the first transistor, the second transistor, and the capacitor are connected, is in a floating state, when the second transistor is turned off.

14. The semiconductor device according to claim 5, wherein the first semiconductor film includes a semiconductor material different from the oxide semiconductor.

15. The semiconductor device according to claim 5, wherein the oxide semiconductor contains at least one of In, Ga, and Zn.

* * * * *